US010142736B2

(12) United States Patent
Noro

(10) Patent No.: US 10,142,736 B2
(45) Date of Patent: Nov. 27, 2018

(54) ELECTROACOUSTIC TRANSDUCER

(71) Applicant: Yamaha Corporation, Hamamatsu-shi, Shizuoka-ken (JP)

(72) Inventor: Masao Noro, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 15/329,596

(22) PCT Filed: Jul. 27, 2015

(86) PCT No.: PCT/JP2015/071259
§ 371 (c)(1),
(2) Date: Jan. 27, 2017

(87) PCT Pub. No.: WO2016/017588
PCT Pub. Date: Feb. 4, 2016

(65) Prior Publication Data

US 2017/0215007 A1 Jul. 27, 2017

(30) Foreign Application Priority Data

Aug. 1, 2014 (JP) ................................ 2014-157857

(51) Int. Cl.
*H04R 9/06* (2006.01)
*H04R 7/16* (2006.01)
(Continued)

(52) U.S. Cl.
CPC ............... *H04R 7/122* (2013.01); *H04R 7/14* (2013.01); *H04R 7/16* (2013.01); *H04R 9/06* (2013.01);
(Continued)

(58) Field of Classification Search
CPC ..................................................... H04R 7/122
See application file for complete search history.

(56) References Cited

U.S. PATENT DOCUMENTS 5,256,837 A 10/1993 Pak
6,863,153 B1 3/2005 Hayakawa et al.
(Continued)

FOREIGN PATENT DOCUMENTS

EP 1 091 616 A1 4/2001
EP 1 182 907 A2 2/2002
(Continued)

OTHER PUBLICATIONS

International Search Report (PCT/ISA/210) issued in PCT Application No. PCT/JP2015/071259 dated Oct. 13, 2015 with English translation (3 pages).

(Continued)

*Primary Examiner* — Duc Nguyen
*Assistant Examiner* — Phan Le
(74) *Attorney, Agent, or Firm* — Crowell & Moring LLP

(57) ABSTRACT

An electroacoustic transducer includes: a diaphragm having two pairs of longitudinal split tubular surfaces; a converter that performs conversion between vibration of the diaphragm and an electric signal; and a supporter supporting the diaphragm. The two pairs of longitudinal split tubular surfaces form valleys and ridge portions. In each pair of the two pairs of longitudinal split tubular surfaces, one-side portions of the respective longitudinal split tubular surfaces form a valley. Another-side portion of the split tubular surface of each one of the two pairs and an other-side portion of the split tubular surface of the other of the two pairs form a ridge portion. The two pairs of longitudinal split tubular surfaces are arranged in at least one of a state in which the valleys are orthogonal to each other and a state in which the ridge portions are orthogonal to each other.

15 Claims, 19 Drawing Sheets

(51) Int. Cl.

| | |
|---|---|
| ***H04R 7/12*** | (2006.01) |
| ***H04R 7/14*** | (2006.01) |
| *H04R 1/22* | (2006.01) |
| *H04R 1/32* | (2006.01) |
| *H04R 17/00* | (2006.01) |
| *H04R 31/00* | (2006.01) |

(52) U.S. Cl.
CPC ................ *H04R 1/22* (2013.01); *H04R 1/323* (2013.01); *H04R 17/00* (2013.01); *H04R 31/003* (2013.01); *H04R 2231/001* (2013.01); *H04R 2307/025* (2013.01); *H05K 999/99* (2013.01)

(56) References Cited

U.S. PATENT DOCUMENTS

| | | | | |
|---|---|---|---|---|
| 2007/0147651 A1 | 6/2007 | Mitobe et al. | | |
| 2007/0189571 A1* | 8/2007 | Corynew ................. | H04R 7/14 | 381/396 |
| 2015/0146898 A1 | 5/2015 | Sakanashi et al. | | |
| 2016/0029128 A1* | 1/2016 | Pircaro .................... | H04R 9/00 | 381/400 |

FOREIGN PATENT DOCUMENTS

| | | | |
|---|---|---|---|
| JP | 2002-78079 | A | 3/2002 |
| JP | 2002-374594 | A | 12/2002 |
| JP | 2007-174233 | A | 7/2007 |
| JP | 2008-92260 | A | 4/2008 |
| JP | 2014-45472 | A | 3/2014 |
| WO | WO 2016/014515 | A1 | 1/2016 |

OTHER PUBLICATIONS

Japanese-language Written Opinion (PCT/ISA/237) issued in PCT Application No. PCT/JP2015/071259 dated Oct. 13, 2015 (4 pages). English translation of document C2 (Japanese-language Written Opinion (PCT/ISA/237) dated Oct. 13, 2015) previously filed on Jan. 27, 2017 (five pages).

Extended European Search Report issued in counterpart European Patent Application No. 15828298.8 dated Feb. 12, 2018 (Nine (9) pages).

* cited by examiner (a)

(b)

ELECTROACOUSTIC TRANSDUCER

TECHNICAL FIELD

The present invention relates to an electroacoustic transducer for a speaker configured to reproduce sounds by vibrating longitudinal split tubular surfaces and to a microphone configured to pick up sounds.

BACKGROUND ART

Typical dynamic speakers include a diaphragm and a voice coil motor which causes piston motion for reciprocating the diaphragm to produce sounds. The typical dynamic speakers function substantially as a point sound source and exhibit a wide directivity at low frequencies but exhibit a sharp directivity over a frequency range equal to or higher than a frequency at which the diameter of a bore of the diaphragm is substantially equal to a half-wavelength of the reproduced sounds. Thus, small speakers using a diaphragm having small bores are used to reproduce sounds at high frequencies.

This also applies to dynamic microphones whose operation principle is reverse to that of the dynamic speakers. That is, small microphones using a diaphragm having a small bore are used to pick up high frequencies with a wide directivity.

In riffell speakers, in contrast, a diaphragm is constituted by a pair of rectangular curved plates, and the directivity is wide at middle and high frequencies. Also, sounds produced by the riffell speaker are radiated in a widthwise direction along a direction of curve of the diaphragm and hardly radiated in a vertical direction. Thus, it is possible to consider that an ideal sound space can be provided by arranging the riffell speakers in a row in the vertical direction as line array speakers.

Patent Documents 1 and 2 disclose conventional riffell speakers.

Patent Document 1 discloses a speaker in which a conductor pattern as a voice coil is printed on a central portion of a polymeric resin film, and the central portion is folded and bonded to form a diaphragm which includes first and second curved vibration portions and a planar plate portion having the conductor pattern, the planar plate portion and first and second curved vibration portions being formed integrally with each other. The planar plate portion of the diaphragm is disposed in a magnetic gap formed in a magnetic circuit, and distal edges of the first and second curved vibration portions are secured to a supporter.

Patent Document 2 discloses a speaker in which a central portion of a diaphragm is folded so as to form a recessed portion in which a flat voice coil wound in an oval annular shape is disposed in two magnetic gaps that are spaced apart from each other in an up and down direction. Also in this speaker, an outer peripheral portion of the diaphragm is secured to an annular frame.

PRIOR ART DOCUMENTS

Patent Documents

Patent Document 1 (Japanese Patent Application Publication No. 2002-78079)

Patent Document 2 (Japanese Patent Application Publication No. 2007-174233)

However, the riffell speaker of this type is not appropriate for reproducing sounds at low frequencies. The riffell speaker needs to be additionally configured as a multi-speaker system using a speaker for low frequencies (i.e., a woofer) to reproduce sounds over the full range of audible frequencies.

For example, a speaker system which is placed on, e.g., a shelf, called a bookshelf speaker system, is oriented in any of the vertical direction and the horizontal direction. In the case where the riffell speaker is used in the bookshelf speaker system, a directivity changes greatly depending upon the orientation of the speaker system placed on, e.g., a shelf, because sounds produced by the riffell speaker are radiated in the horizontal direction along the direction of curve of the diaphragm and hardly radiated in the vertical direction orthogonal to the horizontal direction as described above.

This invention has been developed in view of the above-described situations, and it is an object of the present invention to provide a low-cost electroacoustic transducer using one speaker unit for exhibiting a wide directivity over a wide frequency range extending from low frequencies to high frequencies and having substantially the same directivity even when the speaker unit is disposed in any orientation such as a vertical orientation or a horizontal orientation.

Means for Solving Problem

The inventor of the present invention has analyzed an operation principle of a speaker having a pair of curved vibration surfaces like riffell speakers and found that the width of directivity depends not on a feature in which an area of vibration over a high frequency range centers on a line sound source but on a shape of a diaphragm itself. Thus, the inventor has concluded that in the case where the speaker that performs piston motion with the diaphragm of this shape is applied to a speaker unit, this speaker unit can reproduce sounds also over the low frequency range with a wide directivity over the high frequency range. The inventor has further found that combination of the vibration surfaces with different orientations solves the problem of the difference in directivity between the vertical direction and the horizontal direction of the speaker. The following is means for solving the problem.

An electroacoustic transducer according to the present invention includes: a diaphragm having two pairs of longitudinal split tubular surfaces; a converter that performs conversion between vibration of the diaphragm and an electric signal corresponding to the vibration; and a supporter that supports the diaphragm such that the diaphragm is movable in a vibration direction. The diaphragm is configured such that the two pairs of longitudinal split tubular surfaces form valleys and ridge portions. In each pair of the two pairs of longitudinal split tubular surfaces, one-side portions of the respective longitudinal split tubular surfaces form a valley. An other-side portion of the split tubular surface of each one of the two pairs and an other-side portion of the split tubular surface of the other of the two pairs form a ridge portion. The two pairs of longitudinal split tubular surfaces are arranged in at least one of a state in which the valleys are orthogonal to each other and a state in which the ridge portions are orthogonal to each other.

In this electroacoustic transducer, the longitudinal split tubular surfaces serve as vibration surfaces. Thus, in the case where the present invention is applied to speakers, the speakers have a wide directivity over the middle and high frequency range like riffell speakers. Moreover, the entire diaphragm is vibrated by the converter performs piston motion. Accordingly, the diaphragm generates a high sound pressure also over a low frequency range like dynamic speakers. This construction enables a single speaker unit to function as a full-range speaker unit capable of reproducing sounds having a wide directivity over the full range of audible frequencies including low frequencies and middle and high frequencies.

In this electroacoustic transducer, each of the longitudinal split tubular surfaces exhibits a wide directivity of sounds in a direction along its circumferential direction and a narrow directivity in a direction orthogonal to the direction. In the present invention, the valleys or the ridge portions of the two pairs of longitudinal split tubular surfaces are arranged orthogonal to each other. Thus, sounds produced by the vibration of each pair of the longitudinal split tubular surfaces propagate uniformly at a listening position located along a direction of a normal line extending through an intersection of the valleys or the ridge portions (in the front direction). At listening positions deviating from the direction of the normal line, a relatively large volume of sounds are produced from the pair of the longitudinal split tubular surfaces whose circumferential directions are the nearest to the deviating direction, and a relatively small volume of sounds are produced from the other pair. The two pairs of the longitudinal split tubular surfaces are arranged at different angles. Thus, sounds produced from the pairs of the longitudinal split tubular surfaces are combined with each other complementarily, resulting in a wide directivity in any direction. Accordingly, this electroacoustic transducer exhibits a good directivity regardless of orientation of installation such as the vertical direction or the horizontal direction.

Also in the case where the present invention is applied to microphones, the longitudinal split tubular surfaces serve as the vibration surfaces, and the entire diaphragm is vibrated uniformly, thereby providing good directivity with reliable sensitivity, whereby the microphones can pick up sounds with a wide directivity over a wide frequency range from the low frequencies to the high frequencies. Furthermore, as in the case of the speakers, the microphones have a good directivity regardless of whether the microphones are oriented vertically or horizontally.

The electroacoustic transducer according to the present invention may be configured such that the diaphragm includes: a wing-shaped portion having the two pairs of longitudinal split tubular surfaces; and a cone portion having a conical shape and provided so as to surround an outer circumferential portion of the wing-shaped portion, such that the wing-shaped portion is disposed between a small-diameter-side end portion and a large-diameter-side end portion of the cone portion and such that the converter is secured to the valley of the longitudinal split tubular surfaces.

In the case where the diaphragm is constituted by the wing-shaped portion having the longitudinal split tubular surfaces, the outer circumferential edge has a complicated shape due to the valley extending in a straight line, resulting in complicated construction of the supporter. In the above-described electroacoustic transducer, however, the cone portion having the conical shape such as a circular or oval conical shape and extending from the longitudinal split tubular surfaces is provided between the wing-shaped portion and the supporter, enabling the supporter to have a simple shape such as a round or oval ring shape, resulting in low manufacturing cost.

In this electroacoustic transducer, the cone portion is not only provided so as to surround the outer circumferential portion of the wing-shaped portion but also provided such that the wing-shaped portion is provided between the small-diameter-side end portion and the large-diameter-side end portion of the cone portion. This construction makes it easy to use constructions similar to those used in normal dynamic speakers, for both of the supporter and the converter, resulting in further lower manufacturing cost.

In the electroacoustic transducer according to the present invention, the wing-shaped portion is preferably provided on a front surface of the cone portion.

Components used in normal dynamic speakers can be used for the electroacoustic transducer other than the wing-shaped portion, and the wing-shaped portion is provided on the cone portion so as to have a simple construction, resulting in further lower manufacturing cost.

In this construction, the cone portion preferably has a through hole that opens to a space formed between the cone portion and the wing-shaped portion.

In the case where the space formed between the cone portion and the wing-shaped portion is closed, cavernous resonance may occur. Furthermore, two diaphragms overlap each other, which may cause interference of sounds radiated from the diaphragms, leading to deteriorated characteristics. To solve this problem, the through hole is formed in the cone portion of the diaphragms overlapping each other, so that the space formed between the cone portion and the wing-shaped portion is open, thereby preventing the cavernous resonance. Also, the area of the cone portion is made smaller by the through hole, thereby reducing the function as the diaphragm to reduce the interference. One or more through holes may be formed as long as the cone portion has enough strength to support the wing-shaped portion.

The electroacoustic transducer according to the present invention may be configured such that the cone portion has cutouts that hold opposite end portions of the valleys of the wing-shaped portion.

The valleys are disposed in a small-diameter portion of the cone portion in the longitudinal split tubular surfaces of the wing-shaped portion. Thus, in the case where the cone portion merely has a conical shape such as a circular conical surface shape or an oval circular conical surface shape, the valleys cannot be disposed unless the length of each valley of the wing-shaped portion is shortened. In the present electroacoustic transducer, however, the cutouts are formed in the small-diameter portion of the cone portion, and the opposite end portions of the valleys are fitted in the cutouts, resulting in a longer length of each valley and larger radiation surfaces as the longitudinal split tubular surfaces.

The electroacoustic transducer according to the present invention is preferably configured such that an outer circumferential edge of the wing-shaped portion and an inner circumferential edge of the cone portion are continuously molded integrally with each other.

For example, the wing-shaped portion and the cone portion can be formed integrally with each other by, e.g., vacuum forming of a resin film, thereby easily manufacturing speakers and microphones having a stable quality.

Another aspect of the present invention is an electroacoustic transducer according to the present invention including a diaphragm; a converter that performs conversion between vibration of the diaphragm and an electric signal corresponding to the vibration; and a supporter that supports the diaphragm such that the diaphragm is movable in a first direction. The diaphragm includes four mountain portions each having two curved surfaces protruding respectively in directions intersecting each other. The four mountain portions include a first mountain portion as each of the four mountain portions. The first mountain portion has a first curved surface and a second curved surface as the two curved surfaces. The four mountain portions are arranged such that a first valley is formed between the first curved surface of the first mountain portion and a curved surface of a second mountain portion of the four mountain portions which is adjacent to the first mountain portion and such that a second valley is formed between the second curved surface of the first mountain portion and a curved surface of a third mountain portion of the four mountain portions which is adjacent to the first mountain portion. A direction in which the first valley extends intersects a direction in which the second valley extends.

Another aspect of the present invention is an electroacoustic transducer including: a diaphragm; a converter that performs conversion between vibration of the diaphragm and an electric signal corresponding to the vibration; and a supporter that supports the diaphragm such that the diaphragm is movable in a first direction. The diaphragm includes four mountain portions each having two curved surfaces protruding respectively in directions intersecting each other. The four mountain portions include a first mountain portion as each of the four mountain portions. The first mountain portion has a first curved surface and a second curved surface as the two curved surfaces. The four mountain portions are arranged such that a first valley is formed between the first curved surface of the first mountain portion and a curved surface of a second mountain portion of the four mountain portions which is adjacent to the first mountain portion and such that a second valley is formed between the second curved surface of the first mountain portion and a curved surface of a third mountain portion of the four mountain portions which is adjacent to the first mountain portion. Each of the four mountain portions includes a ridge portion formed by coupling the two curved surfaces to each other.

The two curved surfaces of each of the four mountain portions are formed such that a direction in which the ridge portion of the first mountain portion extends intersects a direction in which the ridge portion of the second mountain portion extends and such that the direction in which the ridge portion of the first mountain portion extends intersects a direction in which the ridge portion of the third mountain portion extends.

Effects of the Invention

In the case where the electroacoustic transducer according to the present invention is applied to a speaker, this speaker provides a higher sound pressure at low frequencies by piston motion and has a wide directivity at middle and high frequencies due to radiation of reproduced sounds from the longitudinal split tubular surfaces. As a result, a full-range speaker unit having a wide directivity over a wide range extending from low frequencies to middle and high frequencies can be achieved by a single speaker unit. The valleys or the ridge portions of the two pairs of longitudinal split tubular surfaces are orthogonal to each other, thereby exhibiting a good directivity regardless of whether the speaker is oriented vertically or horizontally, for example. Furthermore, components used for normal dynamic speakers can be used for the speaker, resulting in lower manufacturing cost. Also in the case where the electroacoustic transducer according to the present invention is applied to a microphone, this microphone can pick up sounds with a wide directivity over a frequency range extending from low frequencies to high frequencies.

EMBODIMENTS

Hereinafter, there will be described, with reference to drawings, embodiments in which electric acoustic devices according to the present invention are applied to speakers.

FIGS. 1-9 illustrate a speaker (an electric acoustic device) according to a first embodiment of the present invention.

1. Overall Construction

The speaker according to this embodiment includes: a diaphragm 1; an actuator 2 (as one example of a converter) for causing reciprocation of the diaphragm 1; a support frame 3 for supporting the diaphragm 1 and the actuator 2; and an edge member 4 for supporting the diaphragm 1 such that the diaphragm 1 is reciprocable relative to the support frame 3.

Figure 2:
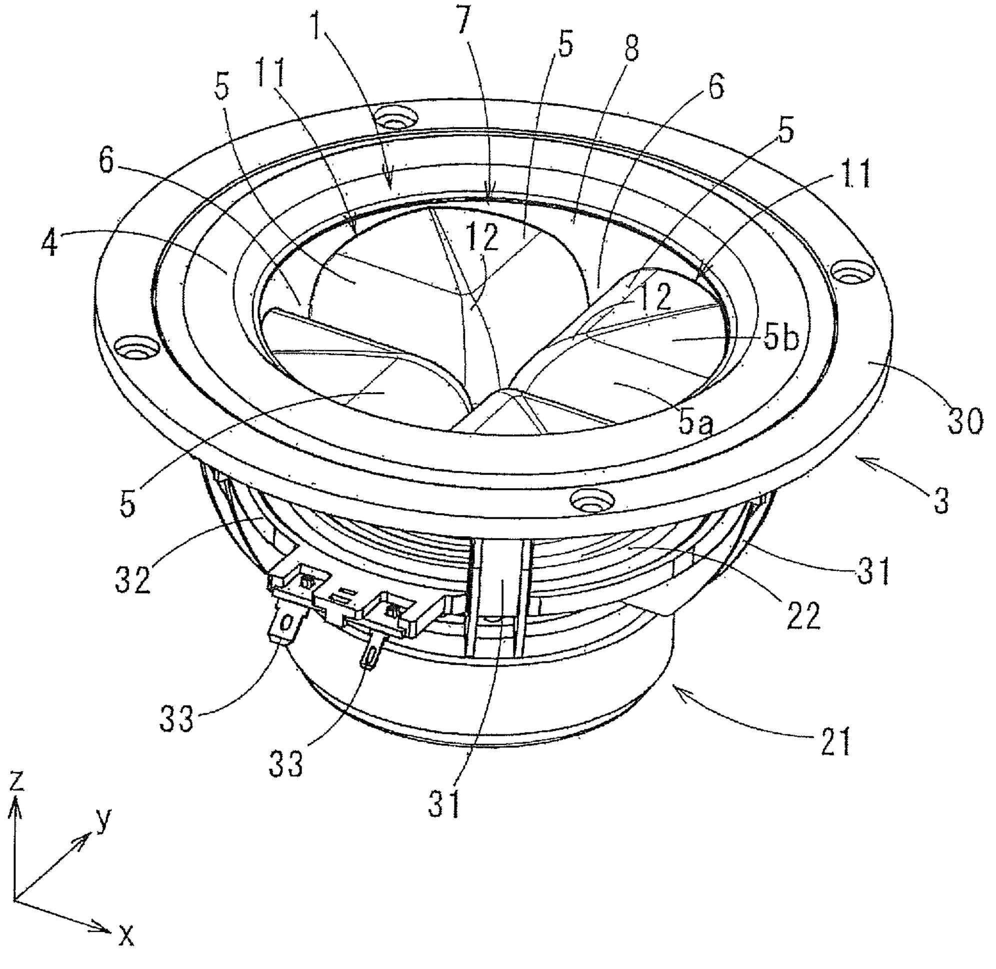
FIG. 2 is a perspective view of the speaker in FIG. 1 in its assembled state.

In the state illustrated in FIG. 2, the up and down direction is defined such that the upper side is a side on which the edge member 4 is provided, and the lower side is a side on which the actuator 2 is provided. The direction which is perpendicular to the up and down direction and in which one of valleys 6 of the diaphragm 1, which will be described below, extends is defined as the x direction. It is noted that the valleys 6 intersect each other by 90 degrees. The direction orthogonal to this x direction is defined as the y direction. The up and down direction may be hereinafter referred to as the z direction with respect to the x direction and the y direction. Surfaces facing upward may be referred to as front surfaces, and surfaces facing downward as back surfaces. The front surfaces may be hereinafter referred to as front elevation surfaces.

2. Constructions of Components (1) Construction of Diaphragm

Figure 3:
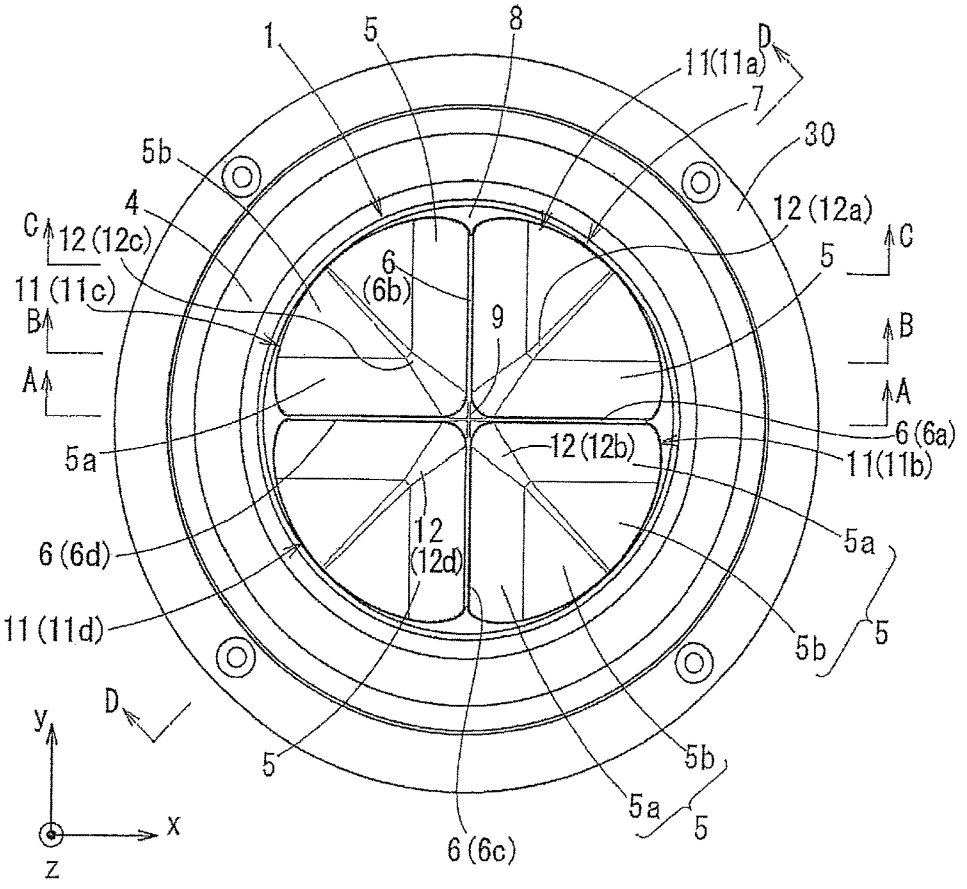
FIG. 3 is a front elevational view of the speaker in FIG. 2.

As illustrated in, e.g., FIGS. 2 and 3, the diaphragm 1 includes a wing-shaped portion 7 and a cone portion 8 extending in a circular conical surface shape so as to surround an outer circumferential portion of the wing-shaped portion 7. The wing-shaped portion 7 has two pairs of longitudinal split tubular surfaces 5 arranged orthogonal to each other on xy plane and joined to each other.

Figure 9:
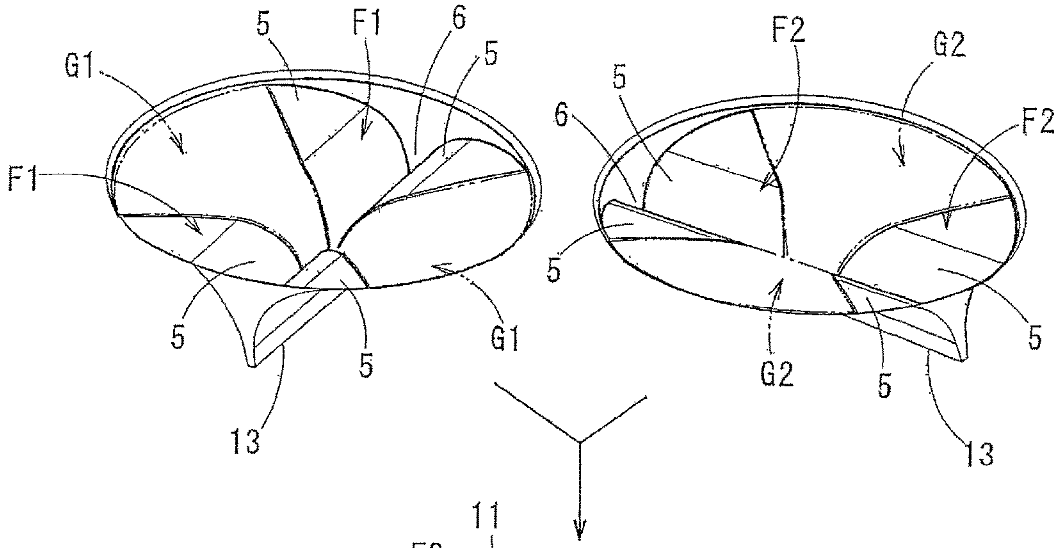
FIG. 9 is an exploded perspective view schematically illustrating constructions of combination of two pairs of longitudinal split tubular surfaces.
Figure 9:
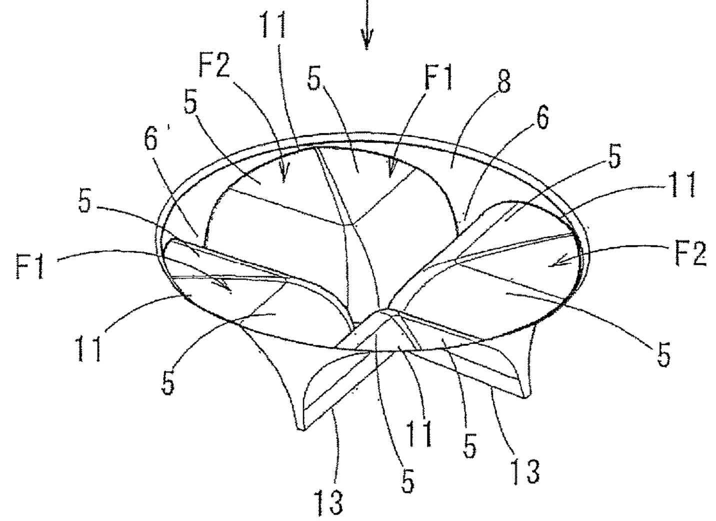

Specifically, as schematically illustrated in FIG. 9(*a*) in which the two pairs of the longitudinal split tubular surfaces 5 are separated, the longitudinal split tubular surfaces 5 in each pair are arranged next to each other, and the valley 6 is formed between a one-side portion of one of the longitudinal split tubular surfaces 5 next to each other and a one-side portion of the other.

It is noted that each of the longitudinal split tubular surfaces 5 is shaped by cutting a portion of a surface of a tube in its longitudinal direction (along the axial direction of the tube). The above-described side portions of the longitudinal split tubular surfaces 5 are side portions in a direction in which the tubular surfaces are curved. As illustrated in FIG. 9(*b*), the diaphragm 1 is shaped such that the two pairs of longitudinal split tubular surfaces 5 are arranged orthogonal to each other on the xy plane and joined to each other. The shape of these joined pairs will be described later in detail.

Each of the longitudinal split tubular surfaces 5 may not be a single arc surface and may have a continuous series of curvatures. Each of the longitudinal split tubular surfaces 5 may be constructed such that a cross section thereof along the circumferential direction (the widthwise direction) of the longitudinal split tubular surfaces 5 has a curvature that changes constantly or continuously like a parabola and a spline curve. Also, each of the longitudinal split tubular surfaces 5 is shaped like a surface of a polygonal tube and may be stepped so as to have a plurality of steps, for example. Each of the longitudinal split tubular surfaces 5 is curved in one direction (the widthwise direction coinciding with the circumferential direction of the longitudinal split tubular surface 5) and extends straight in a direction orthogonal to the one direction (the longitudinal direction of the longitudinal split tubular surfaces 5).

To achieve uniform acoustic characteristics (frequency characteristics and directivity), the longitudinal split tubular surfaces 5 are preferably symmetric with respect to a plane M parallel with the valley 6 and located at a midpoint between tangents L1, L2 at a bottom portion of the valley 6. It is noted that the longitudinal split tubular surfaces 5 may not be symmetric in the present invention.

In the illustrated example, the cross section of each of the longitudinal split tubular surfaces 5 in the widthwise direction is formed so as to include: a portion having an arc surface shape and extending from the valley 6 to a position in the height direction; and a portion having a greater curvature radius or a substantially flat shape from the position in the height direction. The first portion will be referred to as an arc surface portion 5*a*, and the latter portion as an inclined surface portion 5*b* (see FIGS. 2 and 5, for example).

Figure 4:
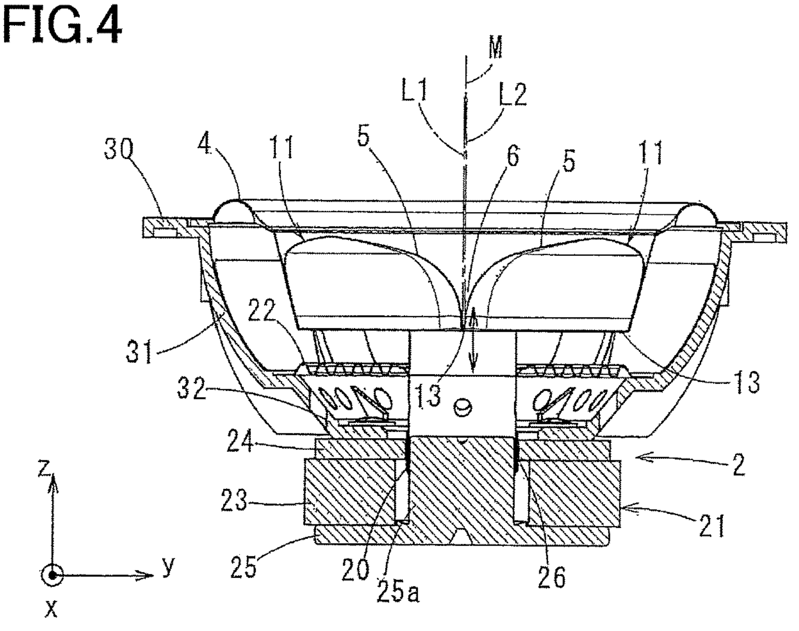
FIG. 4 is a cross-sectional view taken along line A-A in FIG. 3.
Figure 6:
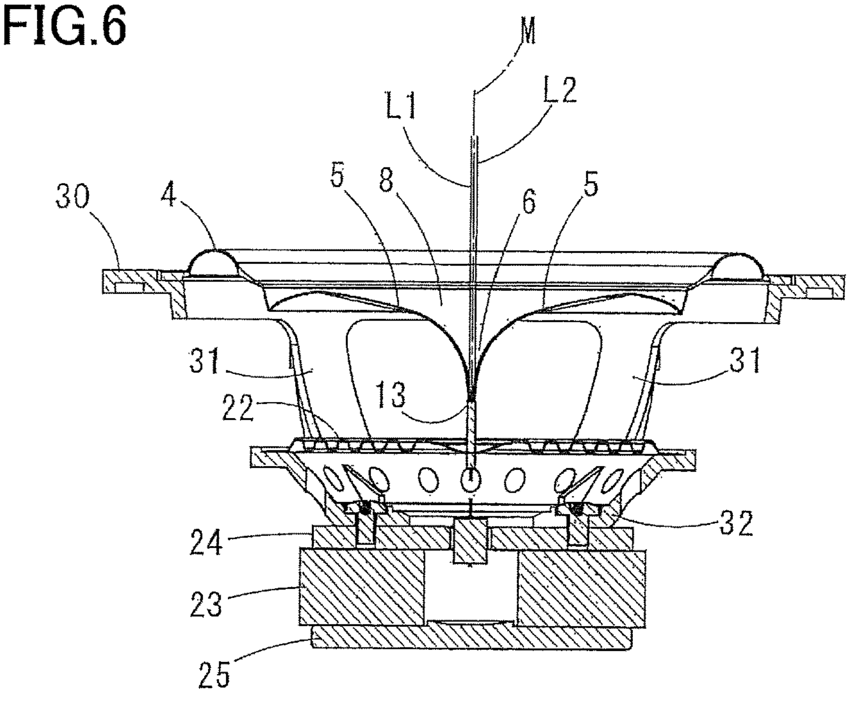
FIG. 6 is an enlarged cross-sectional view of a diaphragm, taken along line B-B in FIG. 3.

The longitudinal split tubular surfaces 5 in each pair, as illustrated in FIGS. 4 and 6, are arranged next to each other in a state in which their respective projecting portions project frontward, and the adjacent side portions of the respective longitudinal split tubular surfaces 5 are joined to each other in a state in which tangent directions each in cross section extending along the circumferential direction of the corresponding longitudinal split tubular surface 5 are substantially parallel with each other. At a joint portion 13, the longitudinal split tubular surfaces 5 are joined so as to be slightly spaced apart from each other, and the tangents L1, L2 are parallel with each other at the joint portion 13 (see FIG. 6). The valley 6 are formed between the longitudinal split tubular surfaces 5 along the joint portion 13 in a straight line that extends along the lengthwise direction of the longitudinal split tubular surfaces 5 (i.e., the axial direction of the tube).

The two pairs of longitudinal split tubular surfaces 5 shaped as described above are joined so as to be orthogonal to each other as illustrated in FIGS. 9(*a*) and 9(*b*). That is, as illustrated in FIG. 9(*a*), each pair of the longitudinal split tubular surfaces 5 includes two pairs of fan-shaped portions F1 or F2 each having the length that increases in the circumferential direction with increase in distance from a central portion of the valley 6 in its longitudinal direction toward a corresponding one of its opposite end portions in the longitudinal direction. Portions G1 and G2 each located between corresponding two of the fan-shaped portions are removed. The two pairs of fan-shaped portions F1 of one of the two pairs of the longitudinal split tubular surfaces 5 and the two pairs of fan-shaped portions F2 of the other of the two pairs of the longitudinal split tubular surfaces 5 are joined to each other so as to be orthogonal to each other at the central portion of the valley 6 and so as to fill in the removed portions G1, G2. In FIG. 9(*a*), the removed portions of the two pairs of longitudinal split tubular surfaces 5 are indicated by the two-dot chain lines for easy understanding.

The wing-shaped portion 7 described above is constructed such that each pair of the longitudinal split tubular surfaces 5 having the above-described shape are arranged so as to be orthogonal to the corresponding valley 6. Thus, as illustrated in FIG. 3, the wing-shaped portion 7 includes: the two valleys 6 arranged orthogonal to each other at the center of the wing-shaped portion 7 so as to be shaped like a cross when viewed from a front surface side (in front elevational view); and four protruding portions 11 protruding frontward and formed by dividing the wing-shaped portion 7 by the valleys 6. The four protruding portions 11 respectively have four ridge portions 12 each inclined with respect to a corresponding one of the valleys 6 by an angle of 45 degrees on the xy plane. Assuming that the longitudinal split tubular surfaces 5 have the other-side portions with respect to the one-side portions that form the valley 6, each of the ridge portions 12 has a smoothly-curved surface that connects between the other-side portions of different pairs of the longitudinal split tubular surfaces 5. In other words, the smoothly-curved surface connects between the inclined surface portions 5*b* and between the arc surface portions 5*a*. These ridge portions 12 are also arranged so as to be orthogonal to each other on the xy plane. It is noted that the wording "orthogonal" is used in each embodiment for the case where two portions or directions in which two portions extend are orthogonal to each other and the case where the two portions or the directions are substantially orthogonal to each other. Also, the wording "perpendicular" is used in each embodiment for the case where two portions or directions in which two portions extend are perpendicular to each other and the case where the two portions or the directions are substantially perpendicular to each other.

The construction of the wing-shaped portion 7 can be explained as follows. As illustrated in FIG. 3, the two pairs of the longitudinal split tubular surfaces 5 are divided by the valleys 6 into the four protruding portions 11. Each of the four protruding portions 11 has the two longitudinal split tubular surfaces 5, 5 (as one example of two curved surfaces). The four protruding portions 11 are arranged such that each of the longitudinal split tubular surfaces 5 of each of the four protruding portions 11 faces a corresponding one of the longitudinal split tubular surfaces 5 of a corresponding adjacent one of the protruding portions 11. For example, assuming that the upper right protruding portion 11 in FIG. 3 is defined as a protruding portion 11*a* as a first mountain portion, a valley 6*a* (as one example of a first valley) is formed between one of the two longitudinal split tubular surfaces 5 of the upper right protruding portion 11*a* (as one example of a first curved surface) and the longitudinal split tubular surface 5 of a lower right protruding portion 11*b* (as one example of a second mountain portion). A valley 6*b* (as one example of a second valley) is formed between the other longitudinal split tubular surface 5 of the upper right protruding portion 11*a* (as one example of a second curved surface) and the longitudinal split tubular surface 5 of an upper left protruding portion 11*c* (as one example of a third mountain portion). The four protruding portions 11 are arranged such that a direction in which the valley 6*a* extends (i.e., a direction perpendicular to the depth direction of the valley 6*a*) is substantially perpendicular to a direction in which the valley 6*b* extends (i.e., a direction perpendicular to the depth direction of the valley 6*b*) in front elevational view in FIG. 3. It is noted that the direction in which the valley 6*a* extends and the direction in which the valley 6*b* extends may not be substantially perpendicular to each other, and the four protruding portions 11 are formed such that the direction in which the valley 6*a* extends intersects the direction in which the valley 6*b* extends. Also in the case where the lower right protruding portion 11*b* is defined as the first mountain portion, for example, a valley 6*c* and the valley 6*a* are substantially perpendicular to each other. Also in the case where the upper left protruding portion 11*c* or a lower left protruding portion 11*d* is defined as the first mountain portion, the above-described relationship is established for the directions in which the valleys extend.

The four protruding portions 11 are arranged such that a direction in which a ridge portion 12*a* of the upper right protruding portion 11*a* as the first mountain portion extends is substantially perpendicular to a direction in which a ridge portion 12*b* of the lower right protruding portion 11*b* (as one example of the second mountain portion) extends and such that the direction in which the ridge portion 12*a* of the upper right protruding portion 11*a* extends is substantially perpendicular to a direction in which a ridge portion 12*c* of the upper left protruding portion 11*c* (as one example of the third mountain portion) extends. It is noted that the direction in which the ridge portion 12*a* extends and the direction in which the ridge portion 12*b* extends may not be substantially perpendicular to each other, and the four protruding portions 11 are formed such that the direction in which the ridge portion 12*a* extends intersects the direction in which the ridge portion 12*b* extends. Also in the case where the lower right protruding portion 11*b* is defined as the first mountain portion, for example, the direction in which the ridge portion 12*b* extends and a direction in which a ridge portion 12*d* extends are substantially perpendicular to each other, and the direction in which the ridge portion 12*b* extends and the direction in which the ridge portion 12*a* extends are substantially perpendicular to each other. Also in the case where the upper left protruding portion 11*c* or the lower left protruding portion is defined as the first mountain portion, the above-described relationship is established for the direction in which the ridge portion extends.

It is noted that corner portions of the four protruding portions 11 are arranged near an intersection portion 9 of the valleys 6. Thus, as illustrated in FIG. 3, the intersection portion 9 is surrounded by the corner portions of the protruding portions 11 and shaped like a flat face that is wider than the width of the straight portion of the valley 6. The joint portion 13 is a portion of the bottom portion of the valleys 6, at which the longitudinal split tubular surfaces 5 are joined to each other and at which the corner portions of the protruding portions 11 are joined to each other. Like the valleys 6, this joint portion 13 is shaped like a cross when viewed from a front surface side (or a back surface side). The joint portion 13 forms a lower end of the wing-shaped portion 7.

The cone portion 8 extends from an outside of each of the protruding portions 11 of the wing-shaped portion 7 (i.e., one of opposite distal ends of each protruding portion 11 which is located on an opposite side from the intersection portion 9). The cone portion 8 closes opposite ends of the two valleys 6 between each pair of the longitudinal split tubular surfaces 5. The cone portion 8 has a circular conical surface shape in its entirety.

That is, as illustrated in the cross sectional views in FIGS. 4 and 6, in the case where the diaphragm 1 is disposed such that the joint portion 13 is located in its lower portion, a large portion of the diaphragm 1 which extends from the joint portion 13 in the height direction serves as the wing-shaped portion 7, and the cone portion 8 serves as a portion of the circular conical surface on an outside of the protruding portions 11. A lower end of the diaphragm 1 is constituted by a lower surface of the joint portion 13 shaped like the intersection with the angle of 90 degrees, and an upper end of the diaphragm 1 is constituted by an upper edge of the cone portion 8 so as to have a round shape.

This diaphragm 1 may be formed of any material such as synthetic resin, paper, and metal which are typically used for diaphragms of speakers. For example, the diaphragm 1 can be formed relatively easily by vacuum forming of a film formed of synthetic resin such as polypropylene and polyester.

In this embodiment, the diaphragm 1 is constituted by a single film formed of synthetic resin, and the joint portion 13 is formed by folding the film in a U-shape in cross section.

(2) Constructions of Components Other than Diaphragm

The actuator 2 includes a voice coil 20 and a magnet mechanism 21 fixed to the support frame 3. A voice coil motor is used for the voice coil 20, for example. The voice coil 20 is provided on a portion of the wing-shaped portion 7 at which the intersection of the joint portion 13 is located.

Figure 1:
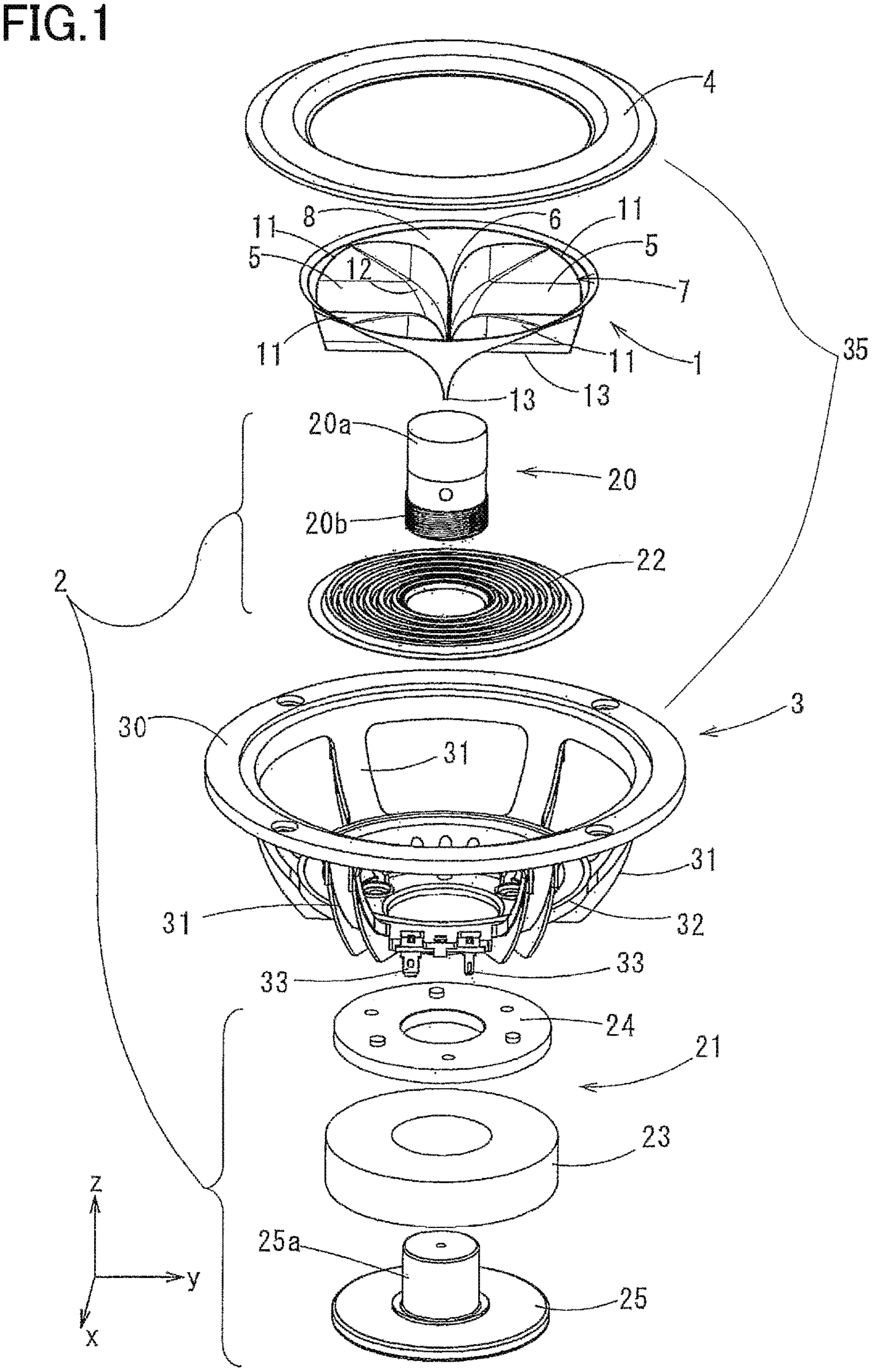
FIG. 1 is an exploded perspective view of a speaker according to a first embodiment of the present invention.
Figure 5:
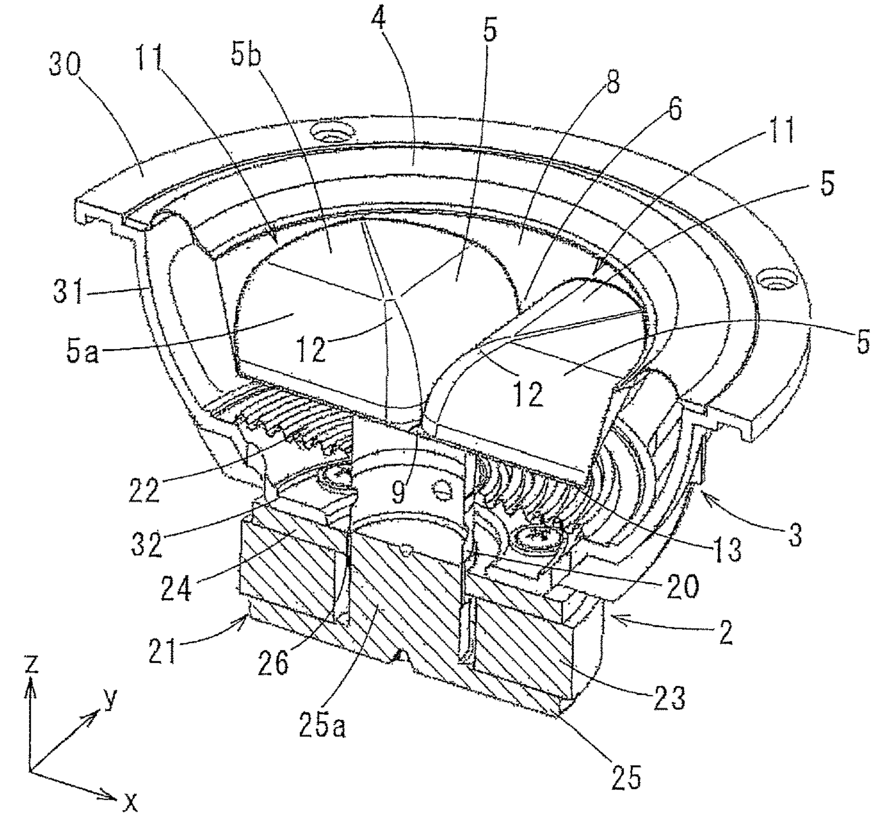
FIG. 5 is a perspective view of a half part of the speaker in FIG. 2, illustrating its cross section.

As illustrated in FIG. 1, the voice coil 20 includes a bobbin 20*a* having a cylindrical shape and a coil 20*b* wound around the bobbin 20*a*. As illustrated in FIG. 5, the center of the intersection portion 9 of the wing-shaped portion 7 is disposed on the axis of the voice coil 20, and an upper end of the voice coil 20 and a lower edge of the joint portion 13 are fixed to each other with, e.g., an adhesive. An outer circumferential portion of the voice coil 20 is supported by the support frame 3, with a damper 22 disposed therebetween. The voice coil 20 is reciprocable with respect to the support frame 3 in the axial direction of the voice coil 20. The damper 22 reduces vibration of the voice coil 20 as needed. The damper 22 may be formed of a material which is used for the typical dynamic speakers. The magnet mechanism 21 includes an annular magnet 23, a ring-shaped outer yoke 24 secured to one of opposite poles of the magnet 23, and an inner yoke 25 secured to the other of the opposite poles of the magnet 23. A distal end portion of a pole 25*a* standing on a center of the inner yoke 25 is disposed in the outer yoke 24, whereby an annular magnetic gap 26 is formed between the outer yoke 24 and the inner yoke 25, and a portion of the voice coil 20 on which the coil 20*b* is wound is disposed in the magnetic gap 26.

The support frame 3 is formed of metal, for example. In the illustrated example, the support frame 3 includes: a flange portion 30 shaped like a circular frame; a plurality of arm portions 31 extending downward from the flange portion 30; and an annular frame portion 32 formed on lower ends of the respective arm portions 31. An inner circumferential surface of the flange portion 30 has an annular shape. The diaphragm 1 is disposed in the inner circumferential surface of the flange portion 30 in a state in which the joint portion 13 faces downward. The upper edge of the cone portion 8 of the diaphragm 1 is supported by an upper surface of the flange portion 30, with the edge member 4 interposed therebetween. Thus, the edge member 4 has a round ring shape corresponding to the shape of the cone portion 8 of the diaphragm 1. This edge member 4 can be formed of a material which is used for the typical dynamic speaker.

A supporter 35 that supports the diaphragm 1 so as to allow its vibration in the direction of the vibration (in the z direction as the depth direction of the valley 6) in the present invention is constituted by the support frame 3 and the edge member 4 in the present embodiment.

The outer yoke 24 of the magnet mechanism 21 is mounted on the annular frame portion 32 of the support frame 3, the magnet mechanism 21 and the support frame 3 are secured together with each other.

Figure 7:
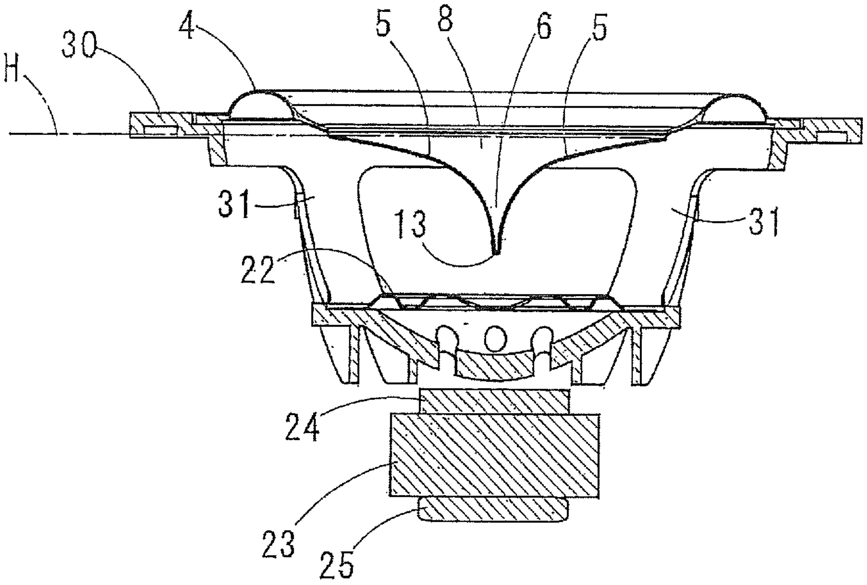
FIG. 7 is an enlarged cross-sectional view of the diaphragm, taken along line C-C in FIG. 3.
Figure 8:
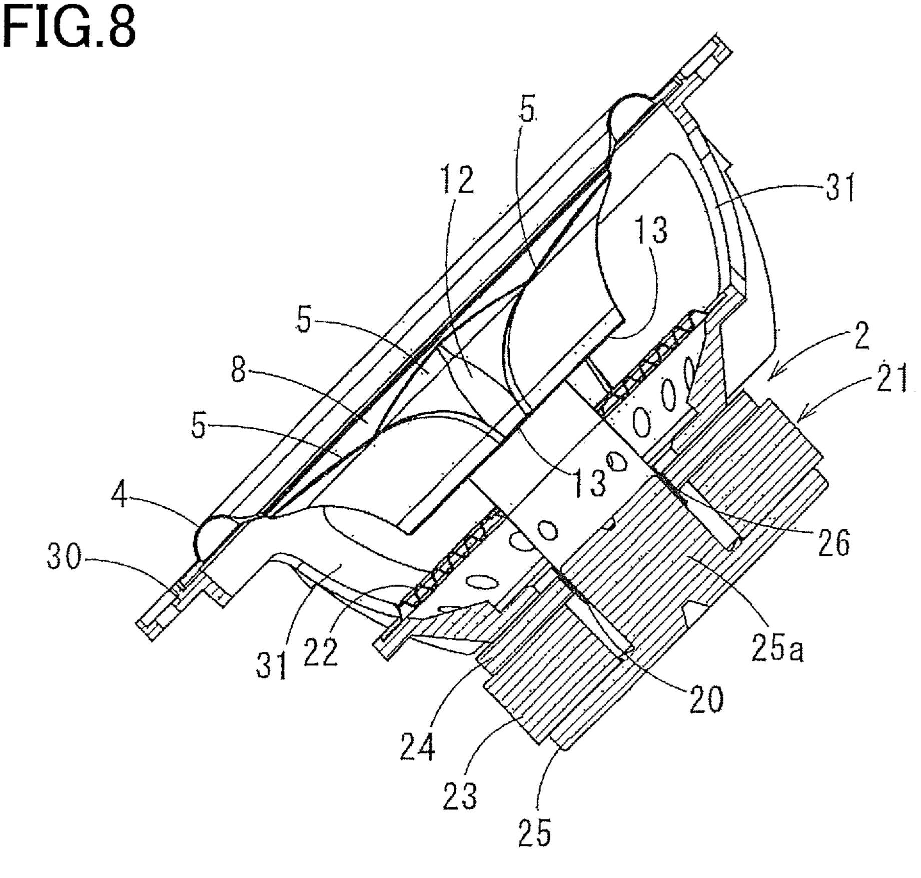
FIG. 8 is an enlarged cross-sectional view of the diaphragm, taken along line D-D in FIG. 3.

As illustrated in FIG. 7, in a state in which the diaphragm 1 is mounted on the support frame 3, in the case where a boundary line H is a line connecting between outermost distal ends of the longitudinal split tubular surfaces 5 in their respective curving directions (in the present embodiment, the distal ends of the inclined surface portions 5*b* at positions where the distance from the valley 6 is longest) on a cross section extending along the circumferential directions of the longitudinal split tubular surfaces 5 opposed to each other with the valley 6 therebetween (the cross section in the widthwise direction), the cross-sectional shape of each of the longitudinal split tubular surfaces 5 is curved in such a direction that a distance between the longitudinal split tubular surface 5 and the boundary line H increases with increase in distance from the distal end of the longitudinal split tubular surface 5 toward the valley 6.

As described above, the longitudinal split tubular surface 5 is not limited to a single arc surface and may be a surface whose cross section has a continuous series of curvatures, a surface whose cross section has a curvature which changes continuously or constantly like a parabola and a spline curve, a surface shaped like a surface of a polygonal tube, and a surface having a plurality of step portions, but the longitudinal split tubular surfaces 5 are preferably shaped so as not to project from the boundary line H connecting between the distal ends of the respective longitudinal split tubular surfaces 5.

It is noted that the reference numeral 33 in, e.g., FIGS. 1 and 2 denotes a terminal for connecting the voice coil 20 to external devices.

3. Operations

In the speaker constructed as described above, when a drive current based on a voice signal is supplied to the voice coil 20 of the actuator 2 secured to the diaphragm 1, a driving force generated based on the drive current is applied to the voice coil 20 by a change in magnetic flux generated by the drive current and a magnetic field in the magnetic gap 26, and the voice coil 20 is vibrated in a direction orthogonal to the magnetic field (i.e., the axial direction of the voice coil 20 or the z direction as the up and down direction indicated by the arrows in FIG. 4). This vibration causes the diaphragm 1 connected to the voice coil 20 to be vibrated along the depth direction of the valleys 6 to radiate reproduced sounds from the front surface of the diaphragm 1.

In this construction, the diaphragm 1 includes: the wing-shaped portion 7 that occupies a large part of the area of the diaphragm 1 to serve as a main surface of radiation of sound waves; and the cone portion 8 disposed on the upper end portion of the wing-shaped portion 7 so as to occupy a portion of the area of the diaphragm 1.

With this construction, the diaphragm 1 has a wide directivity over a large frequency range.

Moreover, the outer circumferential portion of the cone portion 8 is supported by the support frame 3 with the edge member 4 interposed therebetween such that the diaphragm 1 can be vibrated reciprocably. Thus, the entire diaphragm 1 from the joint portion 13 to the outer circumferential portion is vibrated uniformly by the actuator 2, that is, the vibration is caused by what is called piston motion. Accordingly, the diaphragm 1 generates a high sound pressure also over a low frequency range like the dynamic speakers. If the opposite ends of each valley 6 are open, sound waves radiated by the diaphragm partly pass through the open spaces to a back surface side of the diaphragm. However, the opposite ends of each valley 6 are closed by the cone portion 8, preventing the sound waves from passing to the back surface side of the diaphragm, enabling efficient sound emission from the entire front surface of the diaphragm 1.

This construction enables a single speaker unit to function as a full-range speaker unit capable of reproducing sounds having a wide directivity over the full range of audible frequencies including low frequencies and middle and high frequencies.

Each of the longitudinal split tubular surfaces 5 of the diaphragm 1 has a wide directivity of sounds in a direction along the circumferential direction and a narrow directivity in a direction orthogonal to the direction. The diaphragm has the plural pairs of the longitudinal split tubular surfaces 5 which intersect each other at the angle of 90 degrees at the intersection portion 9. Sounds produced by the vibration of each pair of the longitudinal split tubular surfaces 5 propagate uniformly at a listening position located along a direction of a normal line extending through the intersection portion 9 (in the front direction). At listening positions deviating from the direction of the normal line extending through the intersection portion 9, a relatively large volume of sounds are produced from the pair of the longitudinal split tubular surfaces 5 whose circumferential directions are the nearest to the deviating direction, and a relatively small volume of sounds are produced from the other pair.

For example, when the listening position is shifted in the x direction from the front side of the intersection portion 9, a larger volume of sounds are produced from the pair of the longitudinal split tubular surfaces 5 defining the valley 6 extending along the y direction orthogonal to the x direction (in the example illustrated in FIG. 3, the longitudinal split tubular surfaces 5 opposed to each other via the valley 6 extending in the up and down direction in FIG. 3), and a smaller volume of sounds are produced from the pair of the longitudinal split tubular surfaces 5 defining the valley 6 extending along the x direction (in the example illustrated in FIG. 3, the longitudinal split tubular surfaces 5 opposed to each other via the valley 6 extending in the right and left direction in FIG. 3). Conversely, when the listening position is shifted in the y direction from the front side of the intersection portion 9, a larger volume of sounds are produced from the pair of the longitudinal split tubular surfaces 5 defining the valley 6 extending in the x direction, and a smaller volume of sounds are produced from the pair of the longitudinal split tubular surfaces 5 defining the valley 6 extending in the y direction.

When the listening position is shifted from the front side of the intersection portion 9 in a direction between the x direction and the y direction, a relatively large volume of sounds are produced from the pair of the longitudinal split tubular surfaces 5 whose circumferential directions are the nearest to the direction of the shift (in other words, the pair of the longitudinal split tubular surfaces 5 defining the valley 6 whose extending direction is the nearest to a direction orthogonal to the direction of the shift of the listening position), and a relatively smaller volume of sounds are produced from the other pair of the longitudinal split tubular surfaces 5.

Thus, the two pairs of the longitudinal split tubular surfaces 5 of the diaphragm 1 are orthogonal to each other by being arranged respectively at angles different from each other by 90 degrees. Even in the case where the listening position is shifted from the front side in any of the x direction and the y direction, a larger volume of sounds are produced from the pair of the longitudinal split tubular surfaces 5 defining the valley 6 extending along a direction near a direction orthogonal to a direction of the shift, and a smaller volume of sounds are produced from the pair of the longitudinal split tubular surfaces 5 defining the valley 6 extending along a direction near the direction of the shift. Further, the sounds produced from the pairs of the longitudinal split tubular surfaces 5 hardly interfere with each other and are combined with each other complementarily, resulting in a wide directivity in any direction. Accordingly, this electroacoustic transducer exhibits a good directivity regardless of orientation of installation such as the vertical direction or the horizontal direction.

It is noted that a plurality of the speakers may be arranged such that any of the valleys 6 of the diaphragms 1 are continuous to each other, to provide a line array speaker system, enabling achievement of an ideal sound space by a line sound source.

In the present embodiment, an outer circumferential portion of the diaphragm 1 is constituted by the cone portion 8 having the circular conical surface shape, enabling the edge member 4 to have the simple round ring shape. Furthermore, the voice coil 20 of the actuator 2 also has the cylindrical shape, and the upper end portion of the voice coil 20 is fixed to the diaphragm 1. Thus, an actuator used for typical dynamic speakers can be used as the actuator 2. Accordingly, components used for dynamic speakers including a normal conical diaphragm can be also used for the edge member 4, the support frame 3, the actuator 2, and other components, resulting in reduced manufacturing cost.

While the wing-shaped portion 7 and the cone portion 8 are constituted by a single film so as to be formed integrally with each other in the above-described example, protruding portions may be formed individually and bonded to each other via joint portions such that each adjacent two of the longitudinal split tubular surfaces serve as a pair. A reinforcement such as a reinforcing wire or a reinforcing plate shaped like a strip plate may be fixed along the joint portion 13 to reinforce the joint portion 13 in a straight line, for example.

In any construction, the longitudinal split tubular surfaces 5 are preferably provided as projecting surfaces not protruding to the boundary line H that connects between the distal ends of the longitudinal split tubular surfaces 5 which are located on opposite side thereof from the joint portion 13.

FIGS. 10-16 illustrate diaphragms used in other embodiments. The same components as used in the first embodiment are used for the components other than the diaphragm (e.g., the actuator, the support member, and the edge member) in these embodiments. Thus, illustration thereof is omitted, and the same reference numerals as used in the first embodiment are attached in FIGS. 10-16 to designate the corresponding elements, and an explanation of which is simplified.

Figure 10:
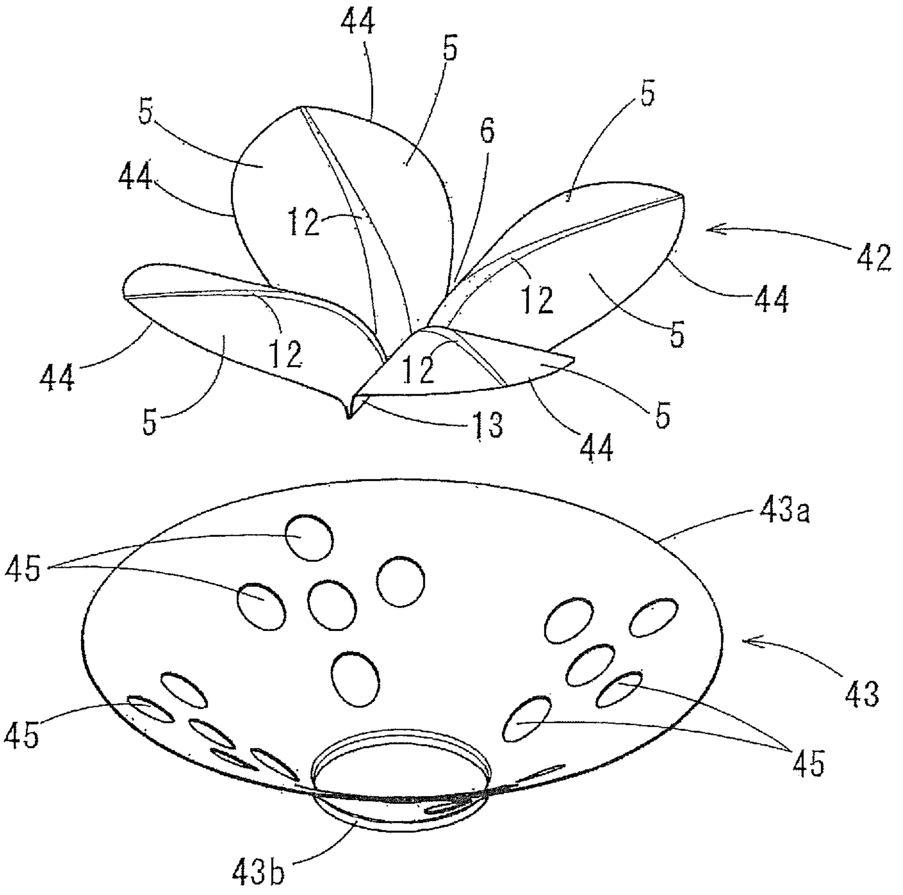
FIG. 10 is an exploded perspective view of a diaphragm in a second embodiment of the present invention.
Figure 11:
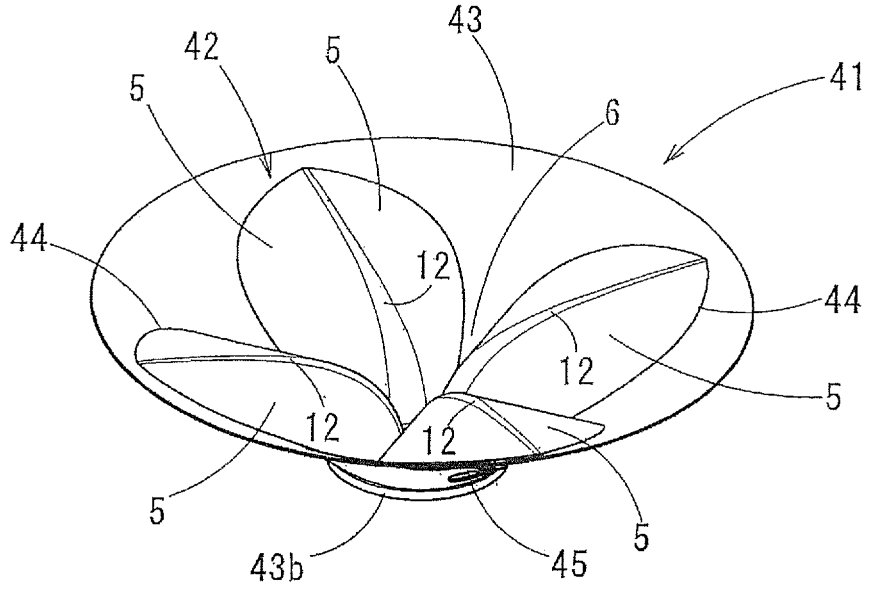
FIG. 11 is a perspective view of the diaphragm in FIG. 10 in its assembled state.
Figure 12:
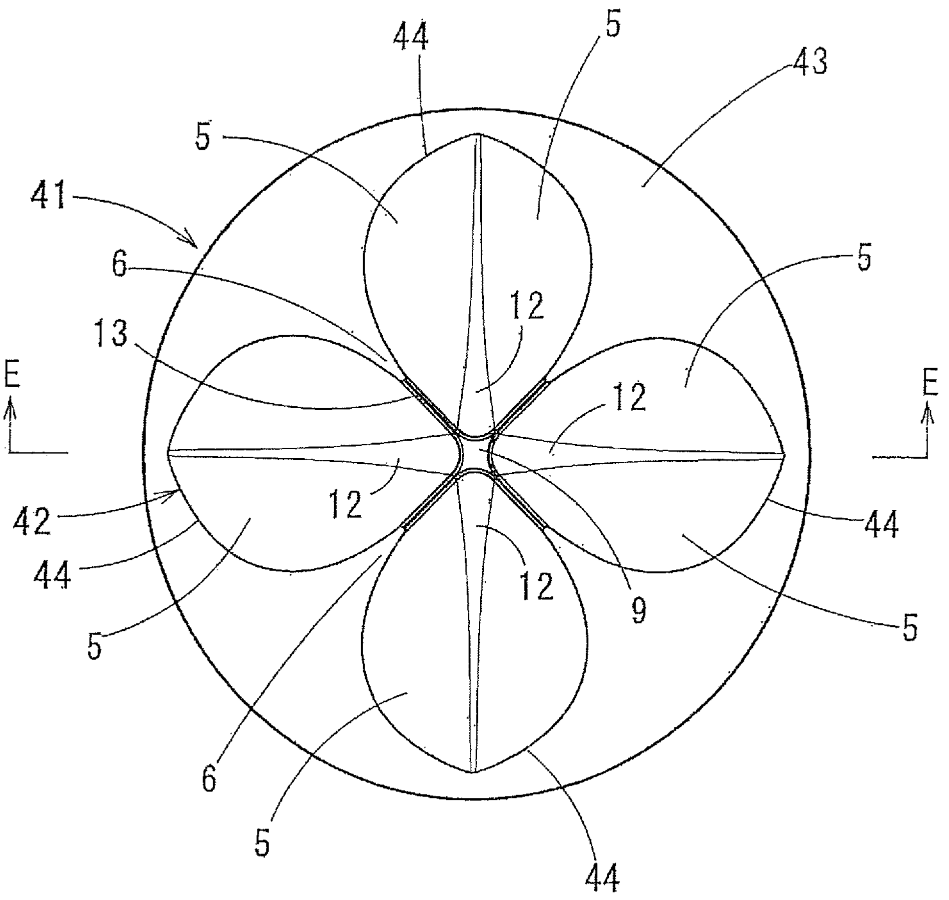
FIG. 12 is a front elevational view of the diaphragm in FIG. 11.

As illustrated in the exploded view of FIG. 10, a diaphragm 41 in a second embodiment illustrated in FIGS. 10-13 includes a wing-shaped portion 42 and a cone portion 43 which are manufactured separately as two diaphragms. The wing-shaped portion 42 is placed on and attached to a front surface of the cone portion 43. The wing-shaped portion 42 is constructed such that four protruding portions 44 are shaped like four flower petals and arranged via the valleys 6 that are shaped like a cross in front elevational view. One-side portions of the longitudinal split tubular surfaces 5 are bonded to each other by the joint portion 13 at a bottom portion of the valleys 6. The length of the cross of the valleys 6 in front elevational view is shorter than that in the first embodiment (see FIGS. 3 and 12). Each of the longitudinal split tubular surfaces 5 is shaped like an arc surface having substantially the same curvature in its entirety unlike the shape constituted by the arc surface portion 5a and the inclined surface portion 5b as in the first embodiment. The protruding portions 44 respectively have the ridge portions 12 shaped like a cross. Each of the ridge portions 12 is inclined with respect to each of the valleys 6 by 45 degrees and smoothly connects between a corresponding adjacent pair of the longitudinal split tubular surfaces 5. Thus, the protruding portions 44 are formed such that the ridge portions 12 each located between the valleys 6 shaped like the cross extend in cross shape respectively in directions each inclined with respect to each valley 6 at 45 degrees.

Figure 13:
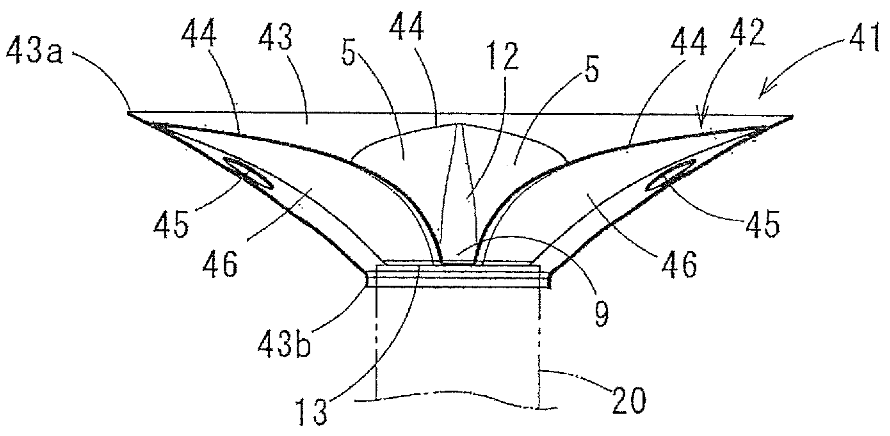
FIG. 13 is a cross-sectional view taken along line E-E in FIG. 12.

The cone portion 43 is shaped like a circular conical surface having a large-diameter-side end portion 43*a* and a small-diameter-side end portion 43*b*. The wing-shaped portion 42 is bonded to a central portion of the cone portion 43 between the large-diameter-side end portion 43*a* and the small-diameter-side end portion 43*b*. A plurality of through holes 45 are formed in the cone portion 43 at its region to which the wing-shaped portion 42 is bonded. Accordingly, the wing-shaped portion 42 is bonded to a front surface of the cone portion 43 so as to cover a region of the cone portion 43 where the through holes 45 are formed. As illustrated in FIG. 13, a cavity portion 46 is formed between the cone portion 43 and the wing-shaped portion 42. The cavity portion 46 is open to a back side of the cone portion 43 through the through holes 45.

In the diaphragm 41 constructed as described above, as illustrated in FIG. 13, the joint portion 13 of the wing-shaped portion 42 is disposed at a lower end of the small-diameter-side end portion 43*b* of the cone portion 43. The voice coil 20 of the actuator which is indicated by the two-dot chain lines in FIG. 13 is joined to the joint portion 13 of the wing-shaped portion 42 and not joined to the small-diameter-side end portion 43*b* of the cone portion 43.

The speaker including the diaphragm 41 is vibrated by the actuator in the depth direction of the valleys 6 of the wing-shaped portion 42, whereby the entire diaphragm 41 is vibrated due to its piston motion. This vibration radiates sounds from the longitudinal split tubular surfaces 5 of the wing-shaped portion 42. If the cavity portion 46 formed between the cone portion 43 and the wing-shaped portion 42 is a closed space, resonance may occur in the cavity portion 46, and sounds radiated from the two diaphragms overlapping each other may interfere with each other. In the diaphragm 41 in the present embodiment, however, the through holes 45 are formed to define the cavity portion 46 as a non-closed space. Furthermore, the portion of the cone portion 43 which overlaps the wing-shaped portion 42 has a mall area as the diaphragm.

Accordingly, reproduced sounds are effectively radiated from the longitudinal split tubular surfaces 5 without being affected by the cone portion 43 located on a back surface side of the wing-shaped portion 42.

It is noted that the number of the through holes 45 may be one or more as long as the cone portion 43 has such strength that the cone portion 43 can support the wing-shaped portion 42. The shape of each of the through holes 45 is not limited to the round shape illustrated in FIG. 10.

Figure 14:
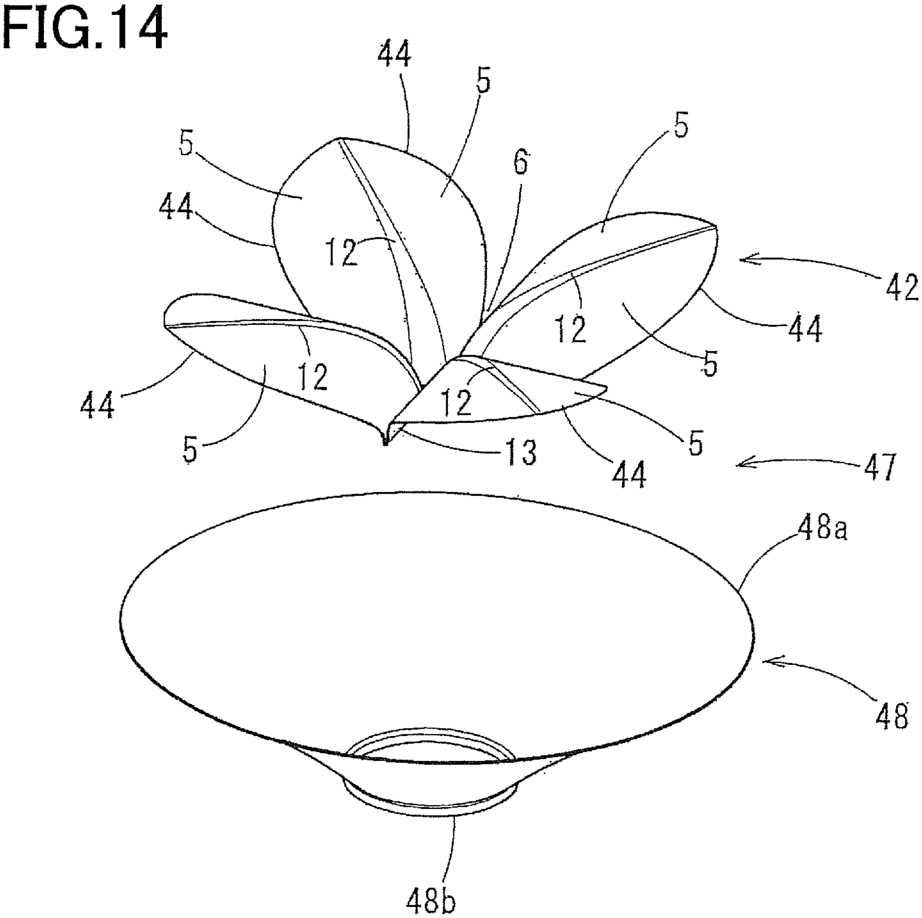
FIG. 14 is an exploded perspective view of a diaphragm in a third embodiment of the present invention.

In the diaphragm 41 in the second embodiment, the portion of the cone portion 43 which overlaps the wing-shaped portion 42 has the through holes 45 that expose the cavity portion 46 to the back side of the cone portion 43. However, the through holes 45 may not be formed in the present invention. As such a diaphragm, the exploded perspective view in FIG. 14 illustrates a diaphragm in a third embodiment. This diaphragm 47 is constructed such that the wing-shaped portion 42 similar in construction to the wing-shaped portion in the second embodiment is attached to a large-diameter-side end portion 48*a* and a small-diameter-side end portion 48*b* of a cone portion 48 having no through holes. This third embodiment is effective in the case where the wing-shaped portion 42 and the cone portion 48 are joined to each other to increase the stiffness. It is noted that while the wing-shaped portion 42 is attached to the front surface of the cone portion 48, other securing means may be used as long as the wing-shaped portion 42 is provided on the front surface of the cone portion 48.

Figure 15:
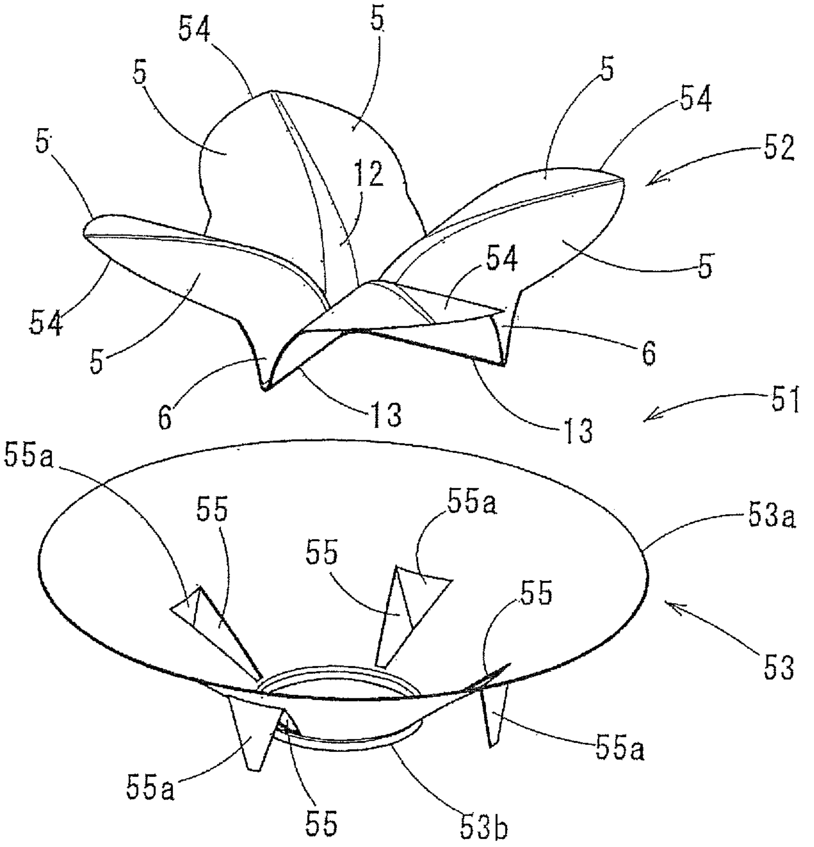
FIG. 15 is an exploded perspective view of a diaphragm in a fourth embodiment of the present invention.
Figure 16:
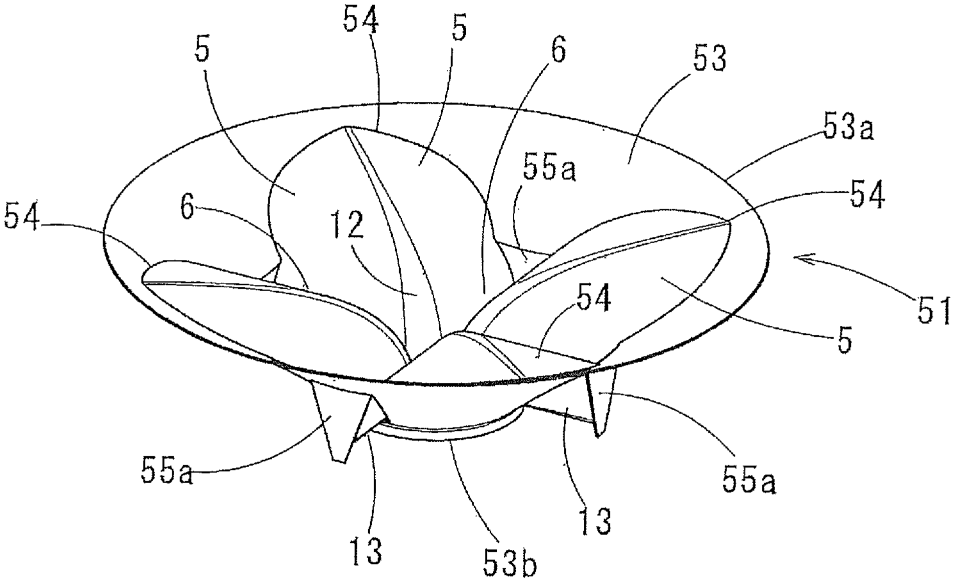
FIG. 16 is a perspective view of the diaphragm in FIG. 15 in its assembled state.
Figure 17:
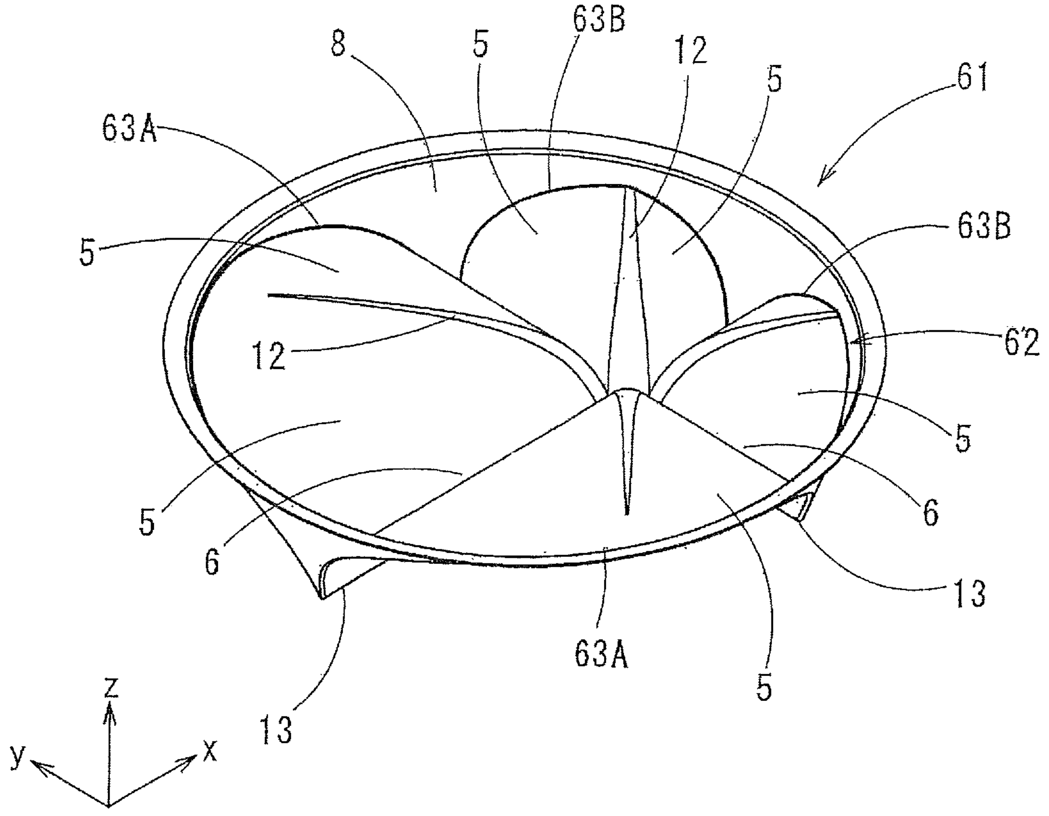
FIG. 17 is a perspective view of the diaphragm in a fifth embodiment of the present invention.

FIGS. 15 and 16 illustrate a diaphragm in a fourth embodiment. Like the diaphragm in the second embodiment, this diaphragm 51 includes a wing-shaped portion 52 and a cone portion 53 which are manufactured separately, and two diaphragms (the wing-shaped portion 52 and the cone portion 53) are joined to each other. Specifically, the wing-shaped portion 52 is attached to a portion of the cone portion 53 between a large-diameter-side end portion 53*a* and a small-diameter-side end portion 53*b*. The wing-shaped portion 52 includes four protruding portions 54 which are arranged such that the longitudinal split tubular surfaces 5 are opposed to each other via the valleys 6 orthogonal to each other in a cross shape. In this embodiment, the cone portion 53 has four cutouts 55 which respectively hold four opposite end portions of the joint portion 13. The wing-shaped portion 52 is attached and secured to the cone portion 53 in a state in which the opposite end portions of the joint portion 13 is fitted in the respective cutouts 55.

In this construction, as illustrated in FIG. 15, the cutouts 55 are formed by cutting V-shaped slits in portions of the cone portion 53 to form triangular tongue pieces 55*a* and pushing the tongue pieces 55*a* downward. As illustrated in FIG. 16, when the opposite end portions of the joint portion 13 are fitted in the respective cutouts 55, openings formed in ends of the valleys 6 of the wing-shaped portion 52 are closed by the respective tongue pieces 55*a*, thereby preventing sound waves radiated from the diaphragm 51 from passing to a back side of the cone portion 53, enabling sound emission from the entire front surface of the diaphragm 51.

The joint portion 13 of the wing-shaped portion 52 has a cross shape in front elevational view. The length of the joint portion 13 is longer than that of the joint portion 13 in the second embodiment. The end portion of each of the valleys 6 is shaped like substantially a triangle that gradually widens from the joint portion 13 as a vertex. In the case where the wing-shaped portion 52 is attached to the front surface of the cone portion having the circular conical surface shape as in the second embodiment, the wing-shaped portion needs to be formed so as to be made gradually smaller toward the joint portion to match the circular conical surface of the cone portion, resulting in short length of the joint portion. In the present embodiment, however, the cone portion 53 has the cutouts 55 in which the opposite end portions of the joint portion 13 are fitted. This construction enables the joint portion 13 to be attached to the cone portion 53 with a long length of the joint portion 13. Accordingly, the diaphragm in which the cone portion 53 having the circular conical surface shape and the wing-shaped portion 42 having the longitudinal split tubular surfaces 5 are joined to each other has a joining structure with few constraints due to the circular conical surface shape of the cone portion 53, enabling achievement of the diaphragm having the longitudinal split tubular surfaces 5 with a large vibration area.

While the cone portion 53 has no through holes in the illustrated example, through holes may be formed in a portion of the cone portion 53 which overlaps the wing-shaped portion 52 as in the second embodiment.

In each of the above-described embodiments, on the xy plane, the central axis of the voice coil coincides with the central portion of the cone portion of the diaphragm, and the intersection portion of the valleys of the wing-shaped portion of the diaphragm coincides with the central portion of the cone portion (i.e., the central axis of the voice coil). As in fifth and sixth embodiments described below, however, the intersection portion of the valleys may be disposed at a position not overlapping the central portion of the cone portion on the xy plane.

Figure 18:
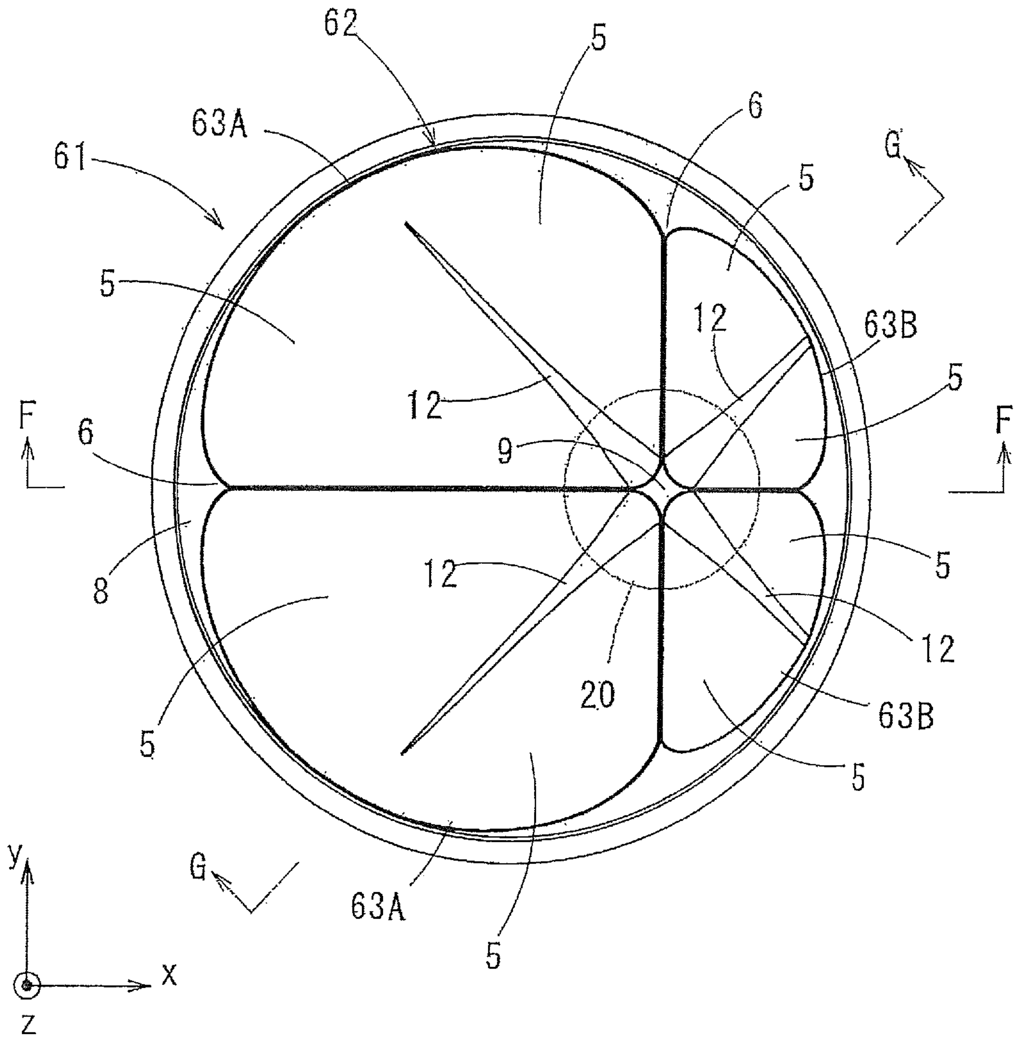
FIG. 18 is a front elevational view of the diaphragm in FIG. 17.
Figure 19:
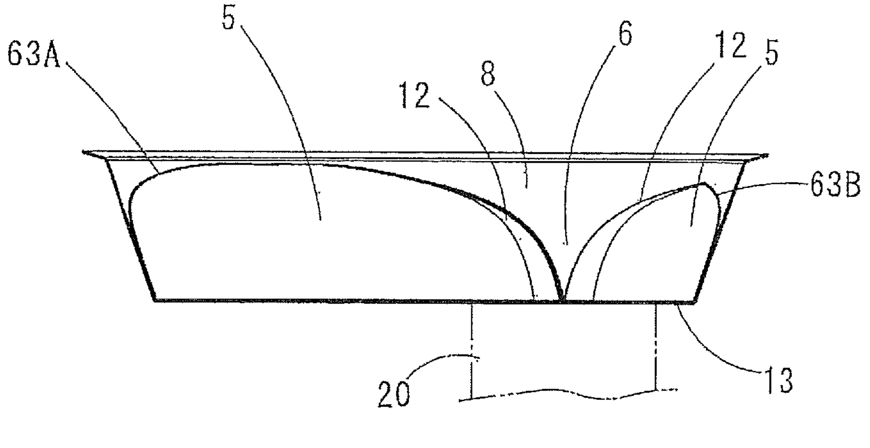
FIG. 19 is a cross-sectional view taken along line F-F in FIG. 18.
Figure 20:
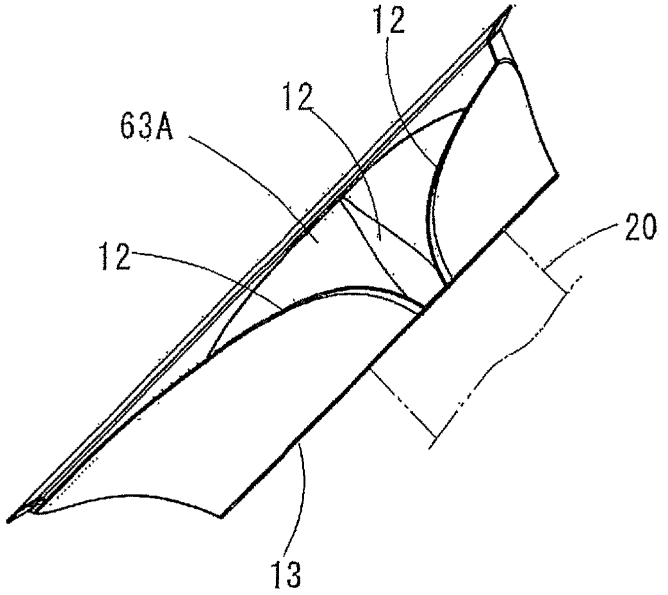
FIG. 20 is a cross-sectional view taken along line G-G in FIG. 18.

A diaphragm 61 in the fifth embodiment illustrated in FIGS. 17-20 is constructed such that the two pairs of the longitudinal split tubular surfaces 5 are constituted by: one pair of the longitudinal split tubular surfaces 5 defining the valley 6 (that extends in the x-axis direction) that is disposed at a position extending through the central portion of the cone portion 8 (i.e., a position on the diameter of the cone portion 8); and the other pair of the longitudinal split tubular surfaces 5 defining the valley 6 (that extends in the y direction) that is disposed at a position located to the right of the central portion of the cone portion 8 in the x direction in FIG. 18 (i.e., a position on a chord not extending through the central portion of the cone portion 8). Thus, the position of the intersection portion 9 of the valleys 6 of a wing-shaped portion 62 does not coincide with the central portion of the cone portion 8 and is located to the right of the central portion in the x-axis direction on the xy plane. Two pairs of protruding portions 63A, 63B are provided. Each of the protruding portions 63A is constituted by the longitudinal split tubular surface 5 having a large area, and each of the protruding portions 63B is constituted by the longitudinal split tubular surface 5 having a small area. In this construction, in the case where the eccentric distance of the intersection portion 9 of the valleys 6 is small, the voice coil 20 of the converter may be disposed on the central portion of the cone portion 8. In the case where the eccentric distance is large, on the other hand, as illustrated in FIGS. 18-20, the voice coil 20 may be disposed on the eccentric intersection portion 9 of the valleys 6.

Figure 21:
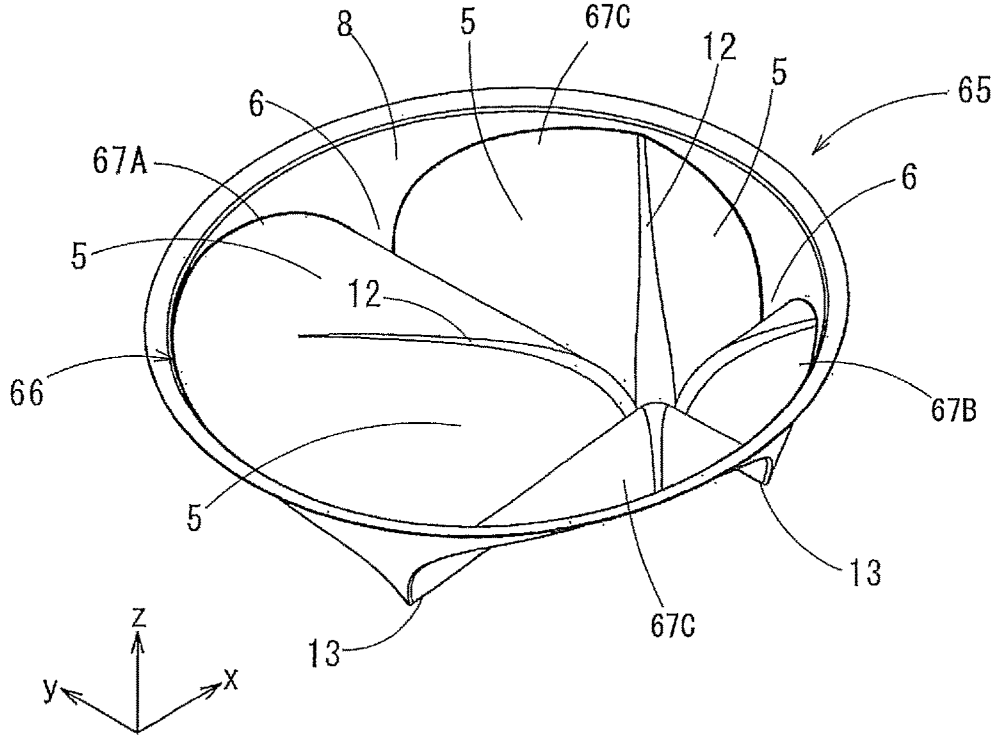
FIG. 21 is a perspective view of a diaphragm in a sixth embodiment of the present invention.
Figure 22:
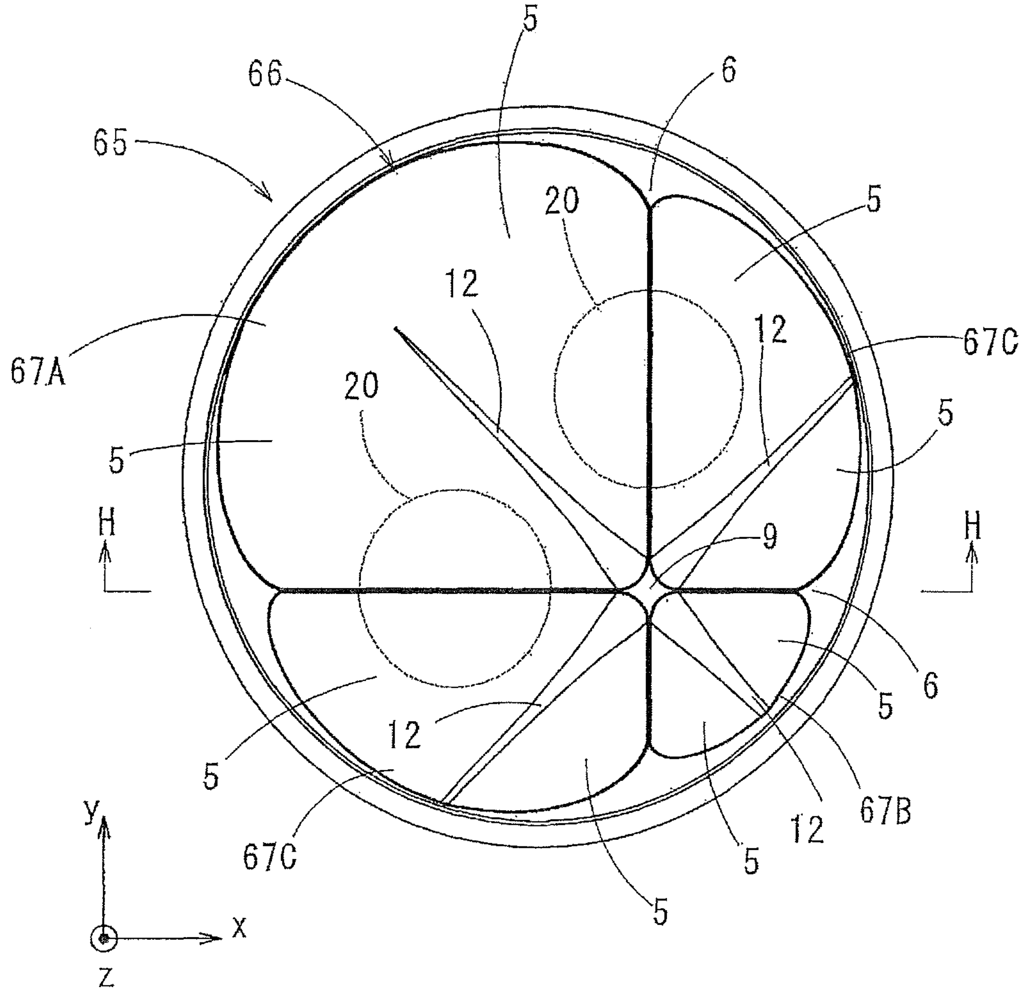
FIG. 22 is a front elevational view of the diaphragm in FIG. 21.
Figure 23:
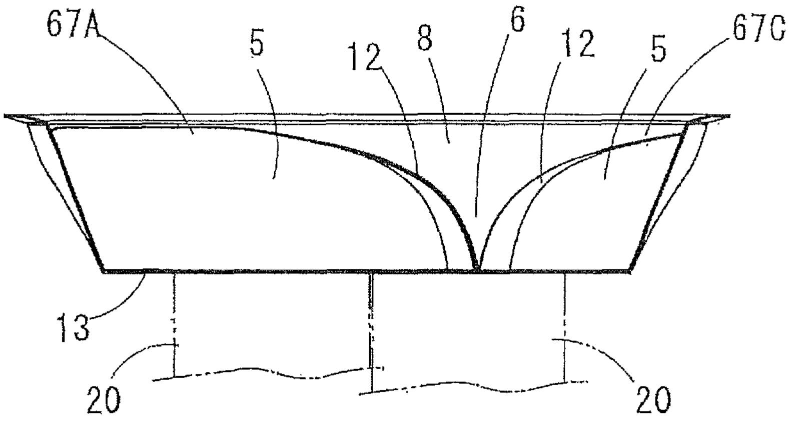
FIG. 23 is a cross-sectional view taken along line H-H in FIG. 22.

In a sixth embodiment illustrated in FIGS. 21-23, a diaphragm 65 is constructed such that the valleys 6 of both of the two pairs of the longitudinal split tubular surfaces 5 constituting a wing-shaped portion 66 are located at positions different from the central portion of the cone portion 8 on the xy plane. The intersection portion 9 of the valleys 6 is different in position from the central portion of the cone portion 8 in the x direction and the y direction. Thus, four protruding portions 67A-67C of three kinds are provided. The protruding portions 67A-67C include the one protruding portion 67A constituted by the longitudinal split tubular surface 5 having the largest area among the longitudinal split tubular surfaces 5; and the one protruding portion 67B constituted by the longitudinal split tubular surface 5 having the smallest area among the longitudinal split tubular surfaces 5. The protruding portions 67A, 67B are respectively located on opposite sides of the intersection portion 9 of the valleys 6, that is, the protruding portions 67A, 67B are located at 180 degrees. The protruding portions 67A-67C further include the two protruding portions 67C each inclined at 90 degrees with respect to the protruding portions 67A, 67B and constituted by the longitudinal split tubular surface 5 having an area different from that of each of the longitudinal split tubular surfaces 5 respectively constituting the protruding portions 67A, 67B.

In this case, the voice coil 20 of the converter is preferably disposed at the center of each of the valleys 6 in its longitudinal direction. Thus, two converters are provided.

The diaphragms 61, 65 in the fifth and sixth embodiments achieve the following operations and effects.

In the case where the eccentric distance of the intersection portion 9 of the valleys 6 is short, and a main axis of the directivity of each of the wing-shaped portions 62, 66 is not far from the central portion of the cone portion 8 as in the first to fourth embodiments, vibrating modes of each of the diaphragms 61, 65 (especially, the wing-shaped portions 62, 66) can be spread appropriately without great change in directivity of the entirety of each of the diaphragms 61, 62. Thus, the shapes of the diaphragms 61, 65 provide a smooth and flat frequency characteristic.

On the other hand, in the case where the eccentric distance of the intersection portion 9 of the valleys 6 is long, and the areas of the longitudinal split tubular surfaces 5 are greatly different from each other in the lengthwise direction or the widthwise direction, the directivity can be strengthened in a direction directed by the longitudinal split tubular surface 5 having the larger area. Thus, the shapes of the diaphragms 61, 65 provide a characteristic in which the main axis of the directivity is inclined with respect to the direction of the normal line.

Accordingly, appropriate setting of the eccentric distance and the eccentric direction enables control of the frequency characteristics of the diaphragms 61, 65 or control of the directivity in any direction, thereby achieving the speakers with appropriate acoustic characteristics.

It is noted that, in the fifth and sixth embodiments, the cone portion may be shaped like an eccentric circular conical surface that is eccentric from its large-diameter side to its small-diameter side thereof, so as to math the eccentric shape of each of the wing-shaped portions 62, 66, such that the center of the small-diameter portion is aligned to the intersection portion 9 of the valleys 6 of each of the wing-shaped portions 62, 66.

Figure 24:
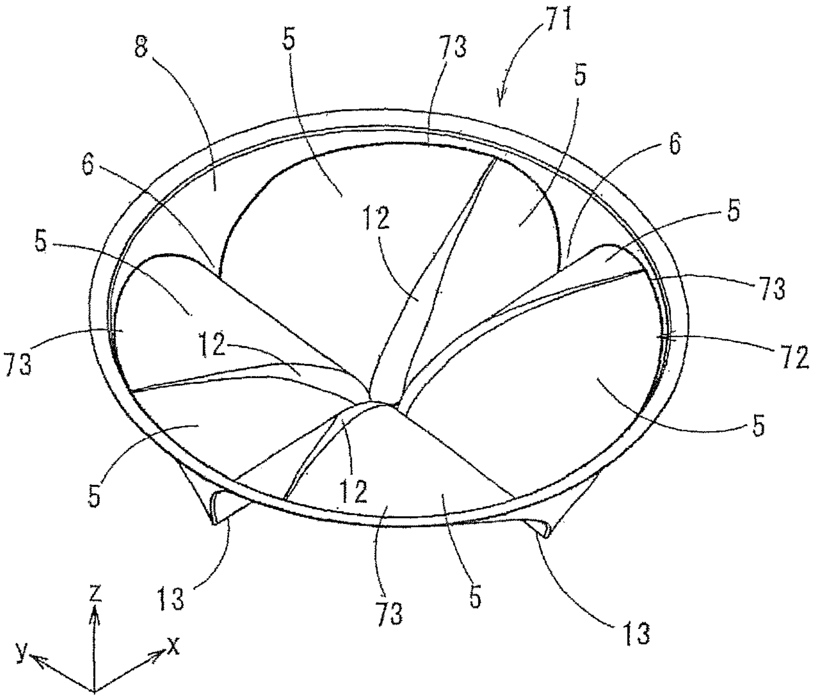
FIG. 24 is a perspective view of a diaphragm in a seventh embodiment of the present invention.
Figure 27:
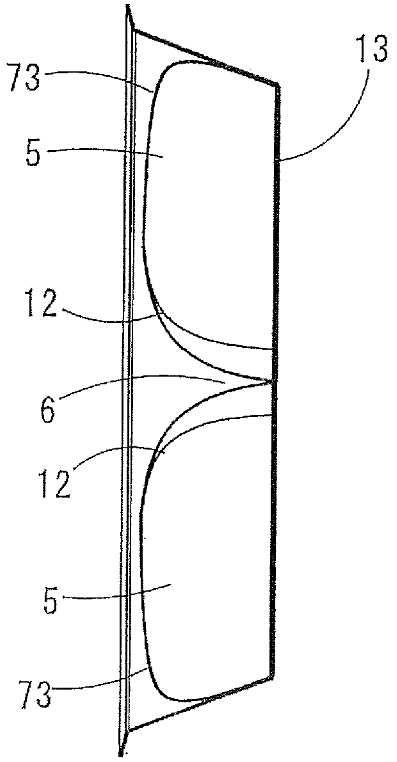
FIG. 27 is a cross-sectional view taken along line K-K in FIG. 25.

FIGS. 24 and 27 illustrate a diaphragm in a seventh embodiment.

In the first embodiment, the valleys 6 of the wing-shaped portion 7 are arranged orthogonal to each other, and the ridge portion 12 of the longitudinal split tubular surfaces 5 in each of the protruding portions 11 is inclined with respect to each valley 6 at 45 degrees. Thus, the ridge portions 12 of the longitudinal split tubular surfaces 5 are also orthogonal to each other. In a diaphragm 71 in the seventh embodiment, in contrast, the valleys 6 of a wing-shaped portion 72 are arranged orthogonal to each other, but the ridge portions 12 of the longitudinal split tubular surfaces 5 in protruding portions 73 are not orthogonal to each other and intersect each other at an angle different from 90 degrees. Thus, one pair of the two pairs of longitudinal split tubular surfaces 5 has an area larger than that of the other pair. Also, in each of the protruding portions 73, the ridge portion 12 is formed by the two longitudinal split tubular surfaces 5 different in area from each other.

Figure 25:
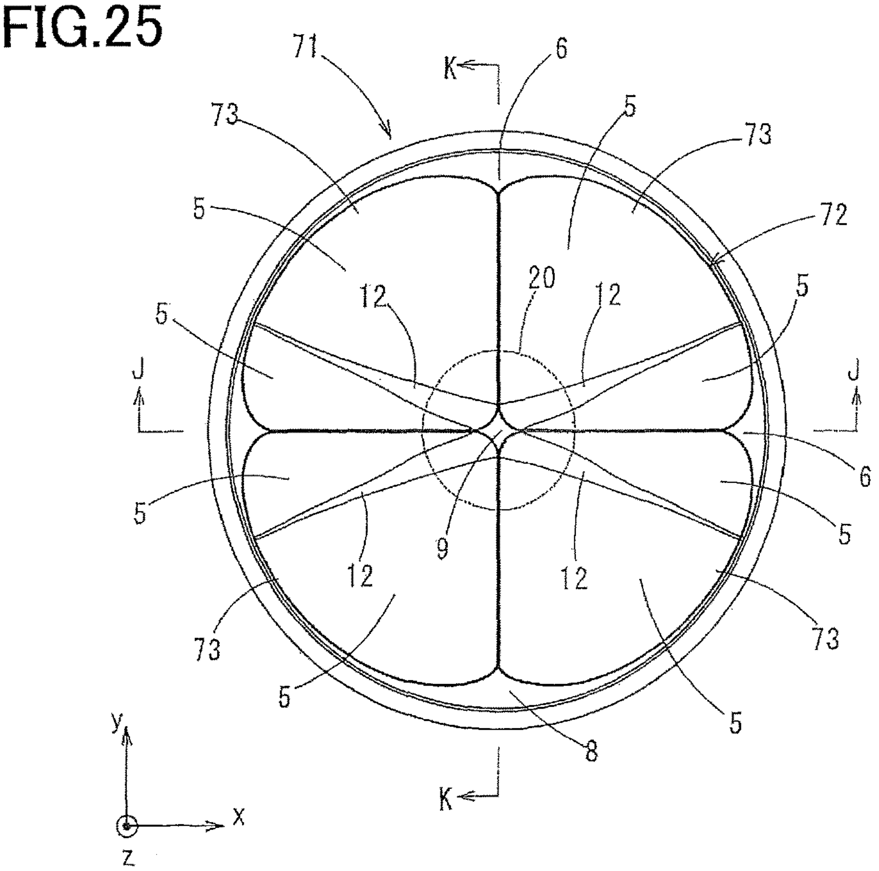
FIG. 25 is a front elevational view of the diaphragm in FIG. 24.
Figure 26:
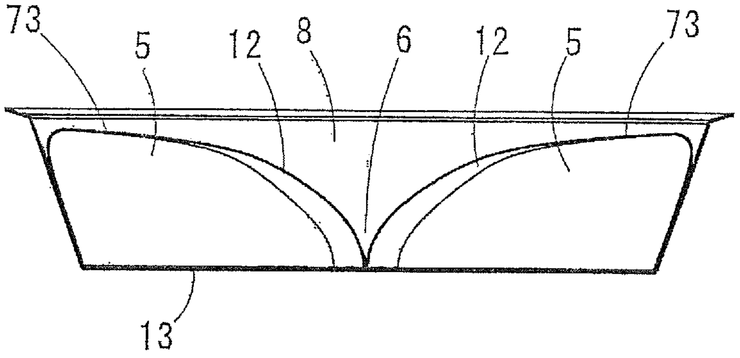
FIG. 26 is a cross-sectional view taken along line J-J in FIG. 25.

Accordingly, contribution of reproduced sound waves are not even between the x direction and the y direction. That is, the directivity is wide in a direction of the pair of the longitudinal split tubular surfaces 5 with a large area, and the directivity is narrow in a direction of the pair of the longitudinal split tubular surfaces 5 with a small area. In the example illustrated in FIG. 25, the area of the pair of the longitudinal split tubular surfaces 5 with the circumferential direction coinciding with the x direction is larger than that of the pair of the longitudinal split tubular surfaces 5 with the circumferential direction coinciding with the y direction. With this construction of the diaphragm 71, the directivity of the circumferential direction (the x direction) of the longitudinal split tubular surfaces 5 with the large area is wide, and the directivity of the circumferential direction (the y direction) of the longitudinal split tubular surfaces 5 with the small area is narrow.

FIGS. 28-31 illustrate a diaphragm in an eighth embodiment.

In the diaphragms in the first to seventh embodiments, the wing-shaped portion is constructed such that the longitudinal split tubular surfaces 5 are arranged as the two pairs via the valleys 6 orthogonal to each other. In a wing-shaped portion 76 of a diaphragm 75 in the eighth embodiment, each pair of the longitudinal split tubular surfaces 5 is disposed such that the ridge portions 12 (the highest ridge portions formed by connecting between side portions of adjacent pairs of the longitudinal split tubular surfaces 5) are orthogonal to each other. In contrast, the valleys 6 are not orthogonal to each other and intersect each other at an angle different from 90 degrees.

Thus, in each pair of the longitudinal split tubular surfaces 5, the longitudinal split tubular surfaces 5 having different areas are arranged as a pair, with the valley 6 interposed therebetween. In each of protruding portions 77, the ridge portion 12 is formed by side portions of the longitudinal split tubular surfaces 5 each having a large area or by side portions of the longitudinal split tubular surfaces 5 each having a small area.

Figure 28:
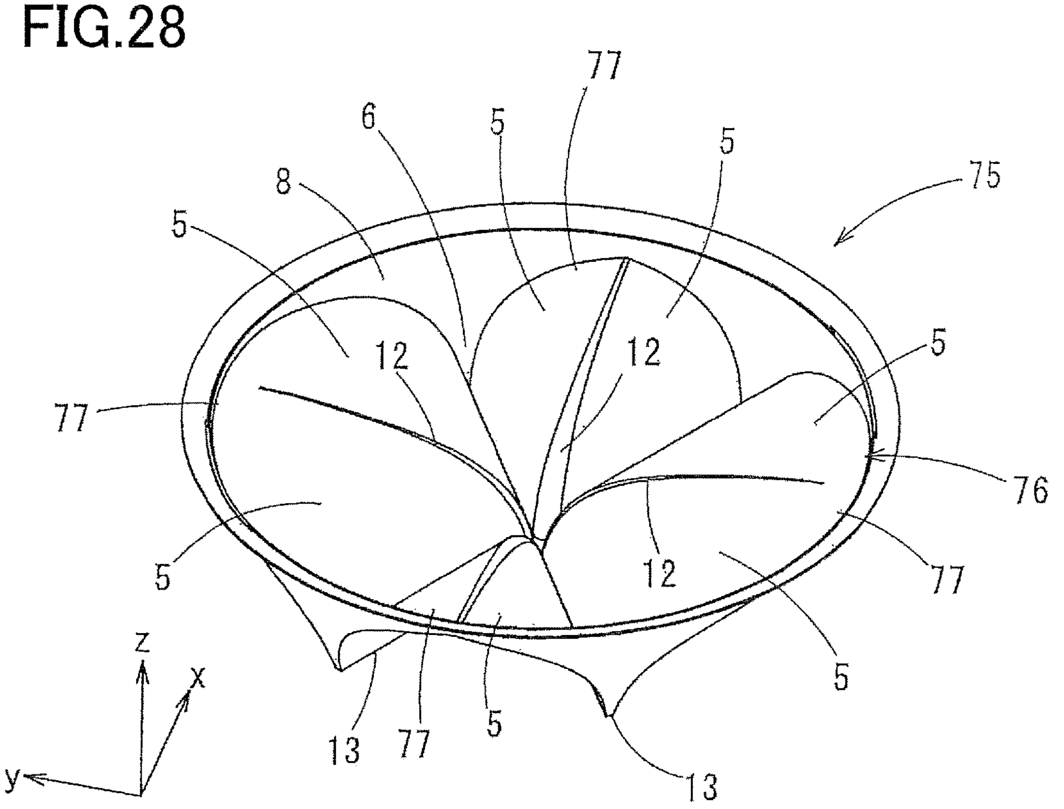
FIG. 28 is a perspective view of a diaphragm in an eighth embodiment of the present invention.
Figure 29:
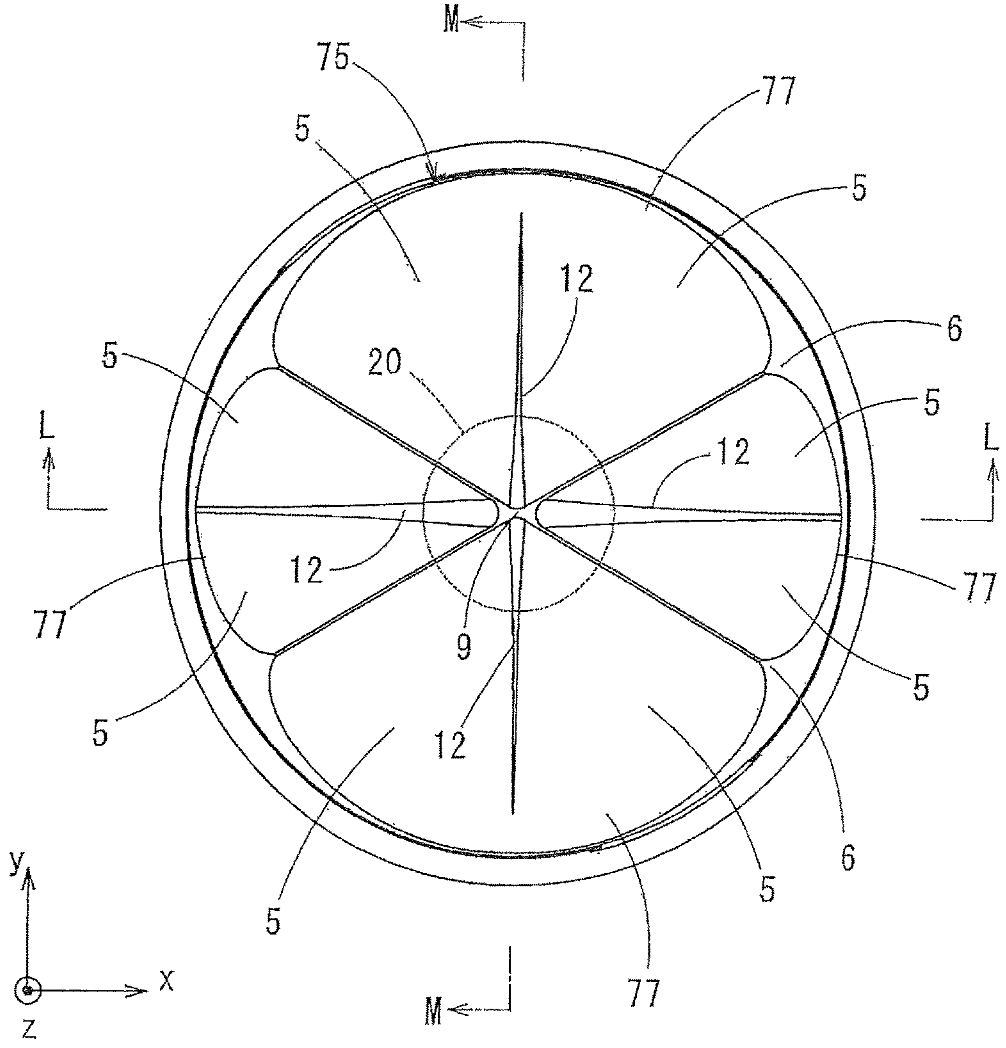
FIG. 29 is a front elevational view of the diaphragm in FIG. 28.
Figure 30:
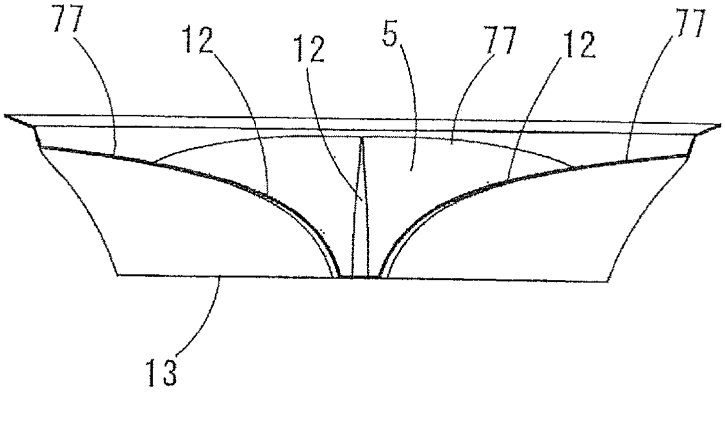
FIG. 30 is a cross-sectional view taken along line L-L in FIG. 29.
Figure 31:
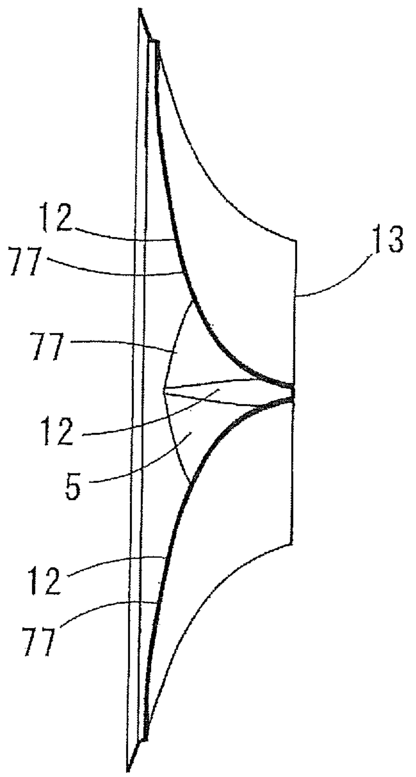
FIG. 31 is a cross-sectional view taken along line M-M in FIG. 29.

It is noted that the x direction and the y direction are defined along the ridge portions 12 in FIGS. 28 and 29.

Also in the case of the diaphragm 75 in the eighth embodiment, contribution of reproduced sound waves are not even between the x direction and the y direction. That is, the directivity is wide in a direction of the pair of the longitudinal split tubular surfaces 5 with the large area, and the directivity is narrow in a direction of the pair of the longitudinal split tubular surfaces 5 with the small area. In the example illustrated in FIG. 29, the area of the protruding portion 77 with the circumferential direction coinciding with the x direction is larger than that of the protruding portion 77 with the circumferential direction coinciding with the y direction. With this construction of the diaphragm 75, the directivity of the circumferential direction (the x direction) of the protruding portion 77 with the large area is wide, and the directivity of the circumferential direction (the y direction) of the protruding portion 77 with the small area is narrow.

The construction in each of the second to sixth embodiments is applicable to the seventh and eighth embodiments.

Examples of such constructions include: (1) a construction in which the wing-shaped portion is manufactured independently of the cone portion and secured to a front surface of the cone portion (the third embodiment) while FIGS. 24-31 illustrate the examples in which the wing-shaped portion and the cone portion are formed integrally with each other; (2) a construction in which through holes are formed in the cone portion in the above-described construction (1) (the second embodiment); (3) a construction in which the cone portion has cutouts in which opposite end portions of the valleys are to be fitted, and tongue pieces corresponding to the respective cutouts respectively close the opposite ends of the valleys (the fourth embodiment); and (4) a construction in which the intersection portion of the ridge portions is not located on the axis of the cone portion in any one of the x direction and the y direction or in both of the x direction and in the y direction (the fifth embodiment or the sixth embodiment).

While the embodiments have been described above, it is to be understood that the disclosure is not limited to the details of the illustrated embodiments, but may be embodied with various changes and modifications, which may occur to those skilled in the art, without departing from the spirit and scope of the disclosure.

For example, while the cone portion has the circular conical surface shape, and the edge member has the round ring shape in the above-described embodiments, the cone portion and the edge member may have an oval conical surface shape and an oval ring shape, respectively. The cone portion may have a shape different from the circular conical surface shape and the oval conical surface shape as long as the cone portion serves as a diaphragm used for typical dynamic speakers. For example, the cone portion may have a circular shape or a polygonal shape in front elevational view, or a shape formed by combining a circular shape with a polygonal shape. That is, the cone portion may have any shape as long as the cone portion is conical as a whole. The shape of the wing-shaped portion is changed as needed so as to match the shape of the cone portion.

Reinforcements such as ribs and blocks may be fixed to a back surface of the diaphragm. Ribs each shaped like a plate or a rod may be fixed to the longitudinal split tubular surfaces, as a radiation surface of the diaphragm, along the circumferential direction. In this speaker, as described above, the longitudinal split tubular surfaces serve as radiation surfaces from which reproduced sounds are radiated. Thus, the directivity is wide along the circumferential direction of each of the longitudinal split tubular surfaces but narrow in a direction perpendicular to the circumferential direction. Accordingly, little audible effects are produced by the ribs each shaped like a plate or a rod provided on the radiation surfaces of the longitudinal split tubular surfaces along the circumferential direction.

The voice coil motor is used as the converter for moving the diaphragm back and forth, but a piezoelectric element may be used instead of the voice coil motor, for example.

While the present invention is applied to the speaker in the above-described embodiments, the present invention may also be applied to microphones. In the case where the present invention is applied to the speakers, the converter such as the voice coil motor converts the electric signal based on the voice signal into the vibrations of the diaphragm. Also in the case where the present invention is applied to the microphones, the voice coil motor may be used as the converter, for example, and this converter converts, into electric signals, vibration of the diaphragm vibrated by sound waves. In the microphones to which the present invention is applied, the longitudinal split tubular surfaces serve as vibration surface, and the entire diaphragm is vibrated uniformly, thereby providing good directivity with reliable sensitivity, whereby the microphones can pick up sounds with a wide directivity over a wide frequency range from low frequencies to high frequencies.

EXPLANATION OF REFERENCE NUMERALS

1: Diaphragm, 2: Actuator (Converter), 3: Support Frame, 4: Edge Member, 5: Longitudinal Split Tubular Surface, **5*a*: Arc Surface Portion, 5*b*: Inclined Surface Portion, 6: Valley, 7: Wing-shaped Portion, 8: Cone Portion, 9: Intersection Portion, 11: Protruding Portion, 12: Ridge Portion, 13: Joint Portion, 20: Voice Coil, 21: Magnet Mechanism, 22: Damper, 23: Magnet, 24: Outer Yoke, 25: Inner Yoke, 25*a*: Pole, 26: Magnetic Gap, 30: Flange Portion, 31: Arm Portion, 32: Annular Frame Portion, 33: Terminal, 41: Diaphragm, 42: Wing-shaped Portion, 43: Cone Portion, 43*a*: Large-diameter-side End Portion, 43*b*: Small-diameter-side End Portion, 44: Protruding Portion, 45: Through Hole, 46: Cavity Portion, 47: Diaphragm, 48: Cone Portion, 48*a*: Large-diameter-side End Portion, 48*b*: Small-diameter-side End Portion, 51: Diaphragm, 52: Wing-shaped Portion, 53**:

Cone Portion, 53*a*: Large-diameter-side End Portion, 53*b*: Small-diameter-side End Portion, 54: Protruding Portion, 55: Cutout, 55*a*: Tongue Piece, 61: Diaphragm, 62: Wing-shaped Portion, 63A, 63B: Protruding Portion, 65: Diaphragm, 66: Wing-shaped Portion, 67A-67C: Protruding Portion, 71: Diaphragm, 72: Wing-shaped Portion, 73: Protruding Portion, 75: Diaphragm, 76: Wing-shaped Portion, 77: Protruding Portion

The invention claimed is:

1. An electroacoustic transducer, comprising:

a diaphragm comprising two pairs of longitudinal split tubular surfaces, each longitudinal split tubular surface having a first fan-shaped portion that is split from a second fan-shaped portion by a gap, wherein the gap widens from a first end to a second end of the longitudinal split tubular surface;

a converter that performs conversion between vibration of the diaphragm and an electric signal corresponding to the vibration; and a supporter that supports the diaphragm such that the diaphragm is movable in a vibration direction, wherein the diaphragm is configured such that the two pairs of longitudinal split tubular surfaces form valleys and ridge portions, wherein in each pair of the two pairs of longitudinal split tubular surfaces, one-side portions of the respective longitudinal split tubular surfaces form a valley, and wherein other-side portions of the split tubular surfaces of each one and the other of the two pairs form a ridge portion, and wherein the two pairs of longitudinal split tubular surfaces are arranged in at least one of a state in which the valleys are orthogonal to each other and a state in which the ridge portions are orthogonal to each other.

2. The electroacoustic transducer according to claim 1, wherein the diaphragm comprises: a wing-shaped portion comprising the two pairs of longitudinal split tubular surfaces; and a cone portion having a conical shape and provided so as to surround an outer circumferential portion of the wing-shaped portion, wherein the wing-shaped portion is disposed between a small-diameter-side end portion and a large-diameter-side end portion of the cone portion, and wherein the converter is secured to the valley of the longitudinal split tubular surfaces.

3. The electroacoustic transducer according to claim 2, wherein the wing-shaped portion is provided on a front surface of the cone portion.

4. The electroacoustic transducer according to claim 3, wherein the cone portion comprises a through hole that opens to a space formed between the cone portion and the wing-shaped portion.

5. The electroacoustic transducer according to claim 2, wherein the cone portion comprises cutouts that hold distal end portions of the valleys of the wing-shaped portion.

6. The electroacoustic transducer according to claim 2, wherein an outer circumferential edge of the wing-shaped portion and an inner circumferential edge of the cone portion are continuously molded integrally with each other.

7. An electroacoustic transducer, comprising:

a diaphragm;

a converter that performs conversion between vibration of the diaphragm and an electric signal corresponding to the vibration; and a supporter that supports the diaphragm such that the diaphragm is movable in a first direction, wherein the diaphragm comprises four mountain portions each comprising two curved surfaces protruding respectively in directions intersecting each other, wherein the four mountain portions comprise a first mountain portion as each of the four mountain portions, and the first mountain portion comprises a first curved surface and a second curved surface as the two curved surfaces, wherein the first curved surface is split from the second curved surface by a gap, and the gap widens from a first end to a second end of the first mountain portion, wherein the four mountain portions are arranged such that a first valley is formed between the first curved surface of the first mountain portion and a curved surface of a second mountain portion of the four mountain portions which is adjacent to the first mountain portion and such that a second valley is formed between the second curved surface of the first mountain portion and a curved surface of a third mountain portion of the four mountain portions which is adjacent to the first mountain portion, and wherein a direction in which the first valley extends intersects a direction in which the second valley extends.

8. The electroacoustic transducer according to claim 7, wherein the four mountain portions arranged such that the direction in which the first valley extends is substantially perpendicular to the direction in which the second valley extends.

9. The electroacoustic transducer according to claim 7, wherein the four mountain portions respectively comprise ridge portions, and directions in which the ridge portions respectively extend are substantially perpendicular to each other.

10. The electroacoustic transducer according to claim 7, wherein the diaphragm comprises: a wing-shaped portion comprising the four mountain portions; and a cone portion having a conical shape and provided so as to surround an outer circumferential surface of the wing-shaped portion, and wherein the wing-shaped portion is disposed between a small-diameter-side end portion and a large-diameter-side end portion of the cone portion, and wherein the converter is secured to at least one of the first valley and the second valley.

11. The electroacoustic transducer according to claim 7, wherein the wing-shaped portion is provided on a front surface of the cone portion.

12. The electroacoustic transducer according to claim 11, wherein the cone portion comprises a through hole that opens to a space formed between the cone portion and the wing-shaped portion.

13. The electroacoustic transducer according to claim 11, wherein the cone portion comprises cutouts that hold distal end portions of the first valley and the second valley.

14. An electroacoustic transducer, comprising:

a diaphragm;

a converter that performs conversion between vibration of the diaphragm and an electric signal corresponding to the vibration; and a supporter that supports the diaphragm such that the diaphragm is movable in a first direction, wherein the diaphragm comprises four mountain portions each comprising two curved surfaces protruding respectively in directions intersecting each other, wherein the four mountain portions comprise a first mountain portion as each of the four mountain portions, and the first mountain portion comprises a first curved surface and a second curved surface as the two curved surfaces, wherein the first curved surface is split from the second curved surface by a gap, and the gap widens from a first end to a second end of the first mountain portion, wherein the four mountain portions are arranged such that a first valley is formed between the first curved surface of the first mountain portion and a curved surface of a second mountain portion of the four mountain portions which is adjacent to the first mountain portion and such that a second valley is formed between the second curved surface of the first mountain portion and a curved surface of a third mountain portion of the four mountain portions which is adjacent to the first mountain portion, wherein each of the four mountain portions comprises a ridge portion formed by coupling the two curved surfaces to each other, wherein the two curved surfaces of each of the four mountain portions are formed such that a direction in which the ridge portion of the first mountain portion extends intersects a direction in which the ridge portion of the second mountain portion extends and such that the direction in which the ridge portion of the first mountain portion extends intersects a direction in which the ridge portion of the third mountain portion extends.

15. The electroacoustic transducer according to claim 14, wherein the two curved surfaces of each of the four mountain portions are formed such that the direction in which the ridge portion of the first mountain portion extends is substantially perpendicular to the direction in which the ridge portion of the second mountain portion extends and such that the direction in which the ridge portion of the first mountain portion extends is substantially perpendicular to the direction in which the ridge portion of the third mountain portion extends.

* * * * *